(12) United States Patent
Lee

(10) Patent No.: US 11,417,266 B2
(45) Date of Patent: Aug. 16, 2022

(54) PIXEL COMPRISING MICRO OR NANO LIGHT-EMITTING ELEMENTS, AND DISPLAY DEVICE INCLUDING THE SAME

(71) Applicant: Samsung Display Co., LTD., Yongin-si (KR)

(72) Inventor: Gi Chang Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/944,940

(22) Filed: Jul. 31, 2020

(65) Prior Publication Data

US 2021/0035492 A1 Feb. 4, 2021

(30) Foreign Application Priority Data

Aug. 2, 2019 (KR) .......................... 10-2019-0094307

(51) Int. Cl.
*G09G 3/32* (2016.01)
*H01L 25/13* (2006.01)

(52) U.S. Cl.
CPC ....... *G09G 3/32* (2013.01); *G09G 2300/0443* (2013.01); *G09G 2300/0819* (2013.01); *G09G 2300/0842* (2013.01); *G09G 2300/0857* (2013.01); *G09G 2300/0861* (2013.01); *G09G 2310/0256* (2013.01); *G09G 2320/0233* (2013.01); *H01L 25/13* (2013.01)

(58) Field of Classification Search
CPC ................. G09G 2320/02; G09G 3/32; G09G 2300/0443; G09G 2300/0861; H01L 25/167

See application file for complete search history.

(56) References Cited

U.S. PATENT DOCUMENTS

| 9,640,558 | B2 | 5/2017 | Kimura |
| 2015/0116191 | A1 | 4/2015 | Qi et al. |
| 2017/0250168 | A1 | 8/2017 | Do et al. |
| 2018/0226019 | A1 | 8/2018 | Tong et al. |
| 2019/0156733 | A1 | 5/2019 | Park et al. |
| 2020/0013766 | A1* | 1/2020 | Kim ...................... H01L 25/167 |
| 2020/0135107 | A1* | 4/2020 | Yan ...................... G09G 3/3258 |

FOREIGN PATENT DOCUMENTS

| CN | 108922476 | 11/2018 |
| KR | 10-1733498 | 5/2017 |
| KR | 10-1845907 | 4/2018 |

\* cited by examiner

*Primary Examiner* — Laurence J Lee
*Assistant Examiner* — Larry Lee
(74) *Attorney, Agent, or Firm* — Kile Park Reed & Houtteman PLLC

(57) ABSTRACT

According to various disclosed examples, a pixel that includes micro light-emitting elements is disclosed as well as a display device that includes such micro light-emitting elements. By way of example, a pixel may include a first electrode and a second electrode spaced apart from each other with light-emitting elements electrically connected to the first electrode and the second electrode. In addition, a first pixel circuit may be connected to a first power source with the first pixel circuit generating a driving current based on a scan signal and a data signal. Further, the pixel may include a first selection circuit that, based on a first selection signal, controls an electrical connection between the first pixel circuit and the first electrode and an electrical connection between a second power source and the second electrode.

20 Claims, 15 Drawing Sheets

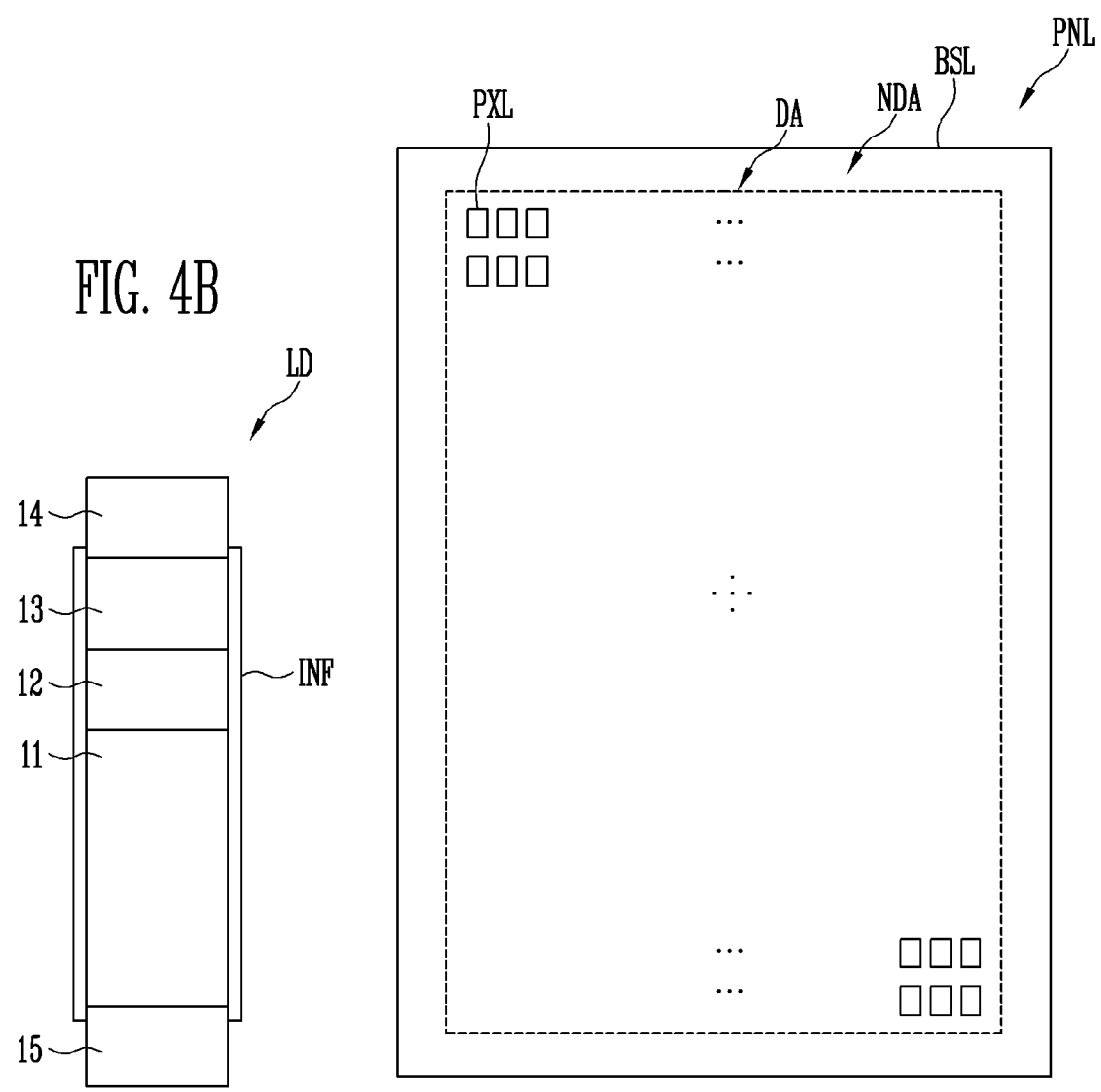

PIXEL COMPRISING MICRO OR NANO LIGHT-EMITTING ELEMENTS, AND DISPLAY DEVICE INCLUDING THE SAME

CROSS-REFERENCE TO RELATED APPLICATION

This application claims priority to and benefits of Korean Patent Application No. 10-2019-0094307 under 35 U.S.C. § 119, filed in the Korean Intellectual Property Office on Aug. 2, 2019, the entire contents of which are incorporated herein by reference.

BACKGROUND

1. Technical Field

Embodiments relate to a display device, and more specifically, to a pixel including light-emitting elements and a display device including the same.

2. Description of the Related Art

Recently, technology has been developed for manufacturing a micro light-emitting element using a material with a highly reliable inorganic crystal structure and manufacturing a light-emitting device using the light-emitting element. For example, technology has been developed for manufacturing micro light-emitting elements having a small size in the range of a nanoscale to a microscale and constituting pixels of a display device using the micro light-emitting elements.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed.

SUMMARY

An embodiment provides a pixel in which an electrode to which a second power source is connected may be determined according to an alignment ratio of light-emitting elements.

In an embodiment, a display device may include a pixel in which an electrode to which a second power source is connected may be determined according to an alignment ratio of light-emitting elements.

It should be understood, however, that the invention may be not to be limited by the foregoing, but may be variously expanded without departing from the spirit and scope of the invention.

A pixel according to an embodiment may include a first electrode and a second electrode spaced apart from each other, and light-emitting elements electrically connected to the first electrode and the second electrode. The pixel may include a first pixel circuit connected to a first power source and generating a driving current based on a scan signal and a data signal, and a first selection circuit that may control an electrical connection between the first pixel circuit and the first electrode and an electrical connection between a second power source and the second electrode, based on a first selection signal.

In an embodiment, the pixel may further include a second pixel circuit connected to the first power source and generating a driving current based on the scan signal and the data signal, and a second selection circuit that may control an electrical connection between the second pixel circuit and the second electrode and an electrical connection between the second power source and the first electrode based on a second selection signal.

In an embodiment, the first selection circuit may include a first selection transistor connected between the first pixel circuit and the first electrode and including a gate electrode connected to a first node, a second selection transistor connected between the second power source and the second electrode and including a gate electrode connected to the first node, a memory element connected to the first node, and a third selection transistor connected between a first selection line for supplying the first selection signal and the memory element and including a gate electrode connected to a control line for supplying a control signal.

In an embodiment, the memory element may include a first inverter and a second inverter which may be mutually feedback-connected with each other between the first node and the third selection transistor.

In an embodiment, the first inverter may include a first inverting transistor connected between the first node and a low power source and including a gate electrode connected to a second node, and a second inverting transistor connected between the first node and a high power source and including a gate electrode connected to the second node.

In an embodiment, the second inverter may include a third inverting transistor connected between the second node and the low power source and including a gate electrode connected to the first node, and a fourth inverting transistor connected between the second node and the high power source and including a gate electrode connected to the first node.

In an embodiment, the memory element may include capacitor coupled between the first node and a third power source.

In an embodiment, the control signal may be substantially the same as the scan signal.

In an embodiment, the second selection circuit may include a first selection transistor connected between the second pixel circuit and the second electrode and including a gate electrode connected to a first node, a second selection transistor connected between the second power source and the first electrode and including a gate electrode connected to the first node, a memory element connected to the first node, and a third selection transistor connected between a second selection line for supplying the second selection signal and the memory element and having a gate electrode connected to a control line for supplying a control signal.

In an embodiment, each of the light-emitting elements may be a first polarity direction light-emitting element or a second polarity direction light-emitting element. The first polarity direction light-emitting element and the second polarity direction light-emitting element may have opposite polarity directions.

In an embodiment, in case that a number of the first polarity direction light-emitting elements is greater than or equal to a number of the second polarity direction light-emitting elements, the first pixel circuit may be electrically connected to the light-emitting elements in response to the first selection signal.

In an embodiment, in case that a number of the first polarity direction light-emitting elements is less than the number of the second polarity direction light-emitting elements, and the second pixel circuit may be electrically connected to the light emitting elements in response to the second selection signal.

In an embodiment, in case that a ratio of the number of the first polarity direction light-emitting elements to the number of the second polarity direction light-emitting elements is greater than or equal to a reference ratio, the first pixel circuit may be electrically connected to the light-emitting elements. In case that the ratio of the number of the first polarity direction light-emitting elements to the number of the second polarity direction light-emitting elements is less than the reference ratio, the second pixel circuit may be electrically connected to the light-emitting elements.

In an embodiment, in case that the first pixel circuit is electrically connected to the light-emitting elements, a voltage of the second power source may be supplied to the second electrode. In case that the second pixel circuit electrically connected to the light-emitting elements, the voltage of the second power source may be supplied to the first electrode.

In an embodiment, each of the first and second pixel circuits may include a first transistor that may control the driving current supplied to the light-emitting elements based on a voltage applied to a gate electrode of the first transistor, and a second transistor connected between a data line for supplying the data signal and the first transistor and including a gate electrode connected to a scan line for supplying the scan signal.

A display device according to an embodiment may include pixels each including light emitting elements electrically connected to a first electrode and a second electrode. The display device may include a scan driver that may supply a scan signal to the pixels through scan lines and supply a control signal to the pixels through control lines, a data driver that may supply a data signal to the pixels through data lines, and a selection signal driver that may supply a first selection signal to the pixels through first selection signal lines and a second selection signal to the pixels through second selection signal lines. Each of the pixels may include a first pixel circuit connected to a first power source and including a first driving transistor that may generate a driving current based on the scan signal and the data signal, a first selection circuit that may electrically connect the first pixel circuit and the first electrode and electrically connect a second power source and the second electrode in response to the first selection signal. Each of the pixels may include a second pixel circuit connected to the first power source and including a second driving transistor that may generate a driving current based on the scan signal and the data signal, and a second selection circuit that may electrically connect the second pixel circuit and the second electrode and electrically connect the second power source and the first electrode in response to the second selection signal.

In an embodiment, the scan driver may perform scanning once to supply the control signal to the control lines during a time period that the display device is driven, and may stop supplying of the control signal.

In an embodiment, the selection signal driver may supply the first selection signal and the second selection signal to each of pixel columns through the first and second selection signal lines, in response to the control signal. The second selection signal may be an inversion signal of the first selection signal.

In an embodiment, each of the light-emitting elements may be a first polarity direction light-emitting element or a second polarity direction light-emitting element. The first polarity light-emitting element and the second polarity light-emitting element may have opposite polarity directions.

In an embodiment, the pixels may include a first pixel including a first electrode connected to the first pixel circuit, and a second electrode connected to the second power source, and a second pixel including a first electrode connected to the second power source, and a second electrode connected to the second pixel circuit.

BRIEF DESCRIPTION OF THE DRAWINGS

FIGS. 4A and 4B are a schematic perspective view and a schematic cross-sectional view illustrating a light-emitting element according to an embodiment.

FIG. 5 is a schematic plan view illustrating a display device according to an embodiment.

DETAILED DESCRIPTION OF THE EMBODIMENTS

Figure 1:
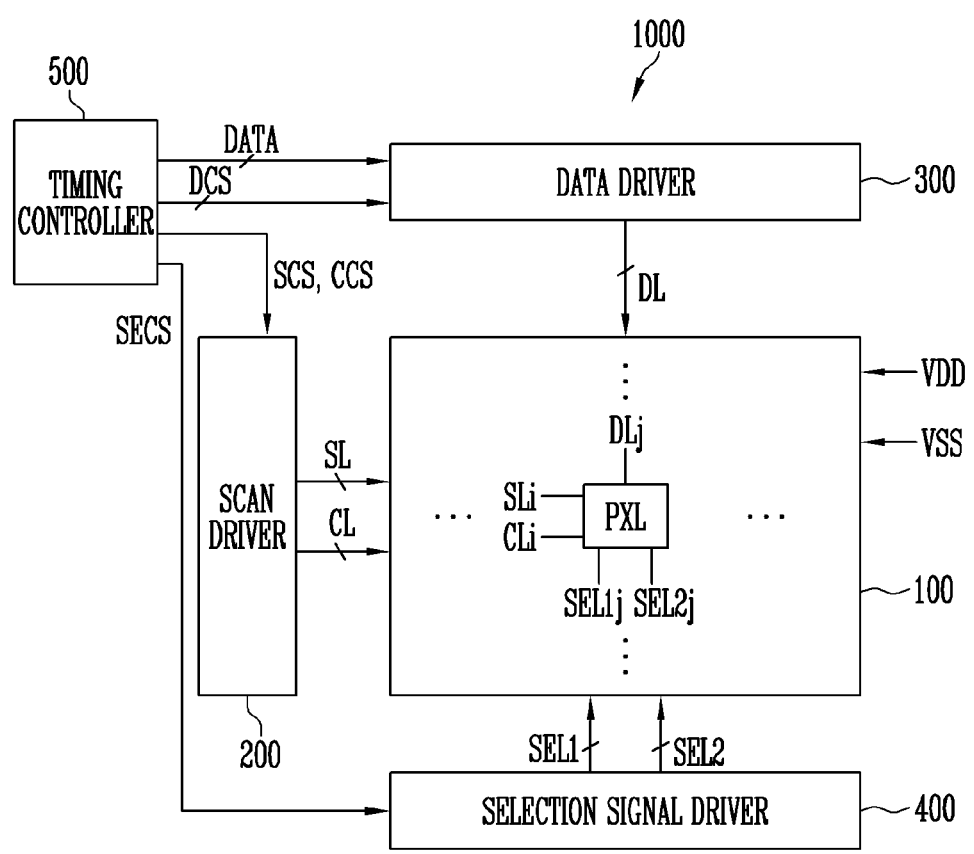
FIG. 1 is a schematic block diagram illustrating a display device according to an embodiment.

Hereinafter, embodiments will be described in more detail with reference to the accompanying drawings. Like numbers refer to like elements throughout the description of the figures, and redundant descriptions of similar components may be omitted.

In the drawings, sizes and thicknesses of elements may be enlarged for clarity and ease of description thereof. However, the disclosure is not limited to the illustrated sizes and thicknesses. In the drawings, the thicknesses of elements may be exaggerated for clarity.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." When possible attributes are listed (e.g., "X may include A, B, and C", "X may be formed of A, B, or C", and the like), it is intended that individual attributes as well as possible combinations of attributes are included for purposes of meaning and interpretation.

The terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art.

"About" or "approximately" as used herein is inclusive of the stated value and may mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic block diagram illustrating a display device according to an embodiment.

Referring to FIG. 1, a display device 1000 may include a display part 100, a scan driver 200, a data driver 300, a selection signal driver 400, and a timing controller 500.

The display device 1000 may be, for example, a flat display device, a flexible display device, a curved display device, a foldable display device, and/or a bendable display device. The display device 1000 may be applied, e.g., as a transparent display device, a head-mounted display device, a wearable display device, and/or the like.

The display part 100 may include scan lines SL, control lines CL, data lines DL, and selection signal lines SEL1 and SEL2. The display part 100 may include pixels PXL connected to the scan lines SL, the control lines CL, the data lines DL, and the selection signal lines SEL1 and SEL2. The display part 100 may be formed inside a display panel.

For example, a pixel PXL disposed in an $i^{th}$ row and a $j^{th}$ column (where i and j may be natural numbers) may be connected to an $i^{th}$ scan line SLi, an $i^{th}$ control line CLi, a $j^{th}$ data line DLj, a $j^{th}$ first selection signal line SEL1j, and a $j^{th}$ second selection signal line SEL2j.

A pixel PXL may include a light-emitting element according to an embodiment of FIGS. 2A to 4B. For example, the pixel PXL may include micro light-emitting elements having a small size ranging from a nanoscale to a microscale. In an example, each pixel PXL may include light-emitting elements that may be connected in parallel to each other between pixel electrodes and/or power lines to constitute a light source or a light source part of the pixel PXL.

In an example, a pixel PXL may include a first pixel circuit, a first selection circuit, a second pixel circuit, a second selection circuit, and light-emitting elements.

The timing controller 500 may generate a first control signal SCS, a second control signal CCS, a third control signal DCS, and a fourth control signal SECS in response to external synchronization signals. The first control signal SCS and the second control signal CCS may be supplied to the scan driver 200. The third control signal DCS may be supplied to the data driver 300. The fourth control signal SECS may be supplied to the selection signal driver 400. The timing controller 500 may realign input image data supplied from the outside into image data DATA and may supply the image data DATA to the data driver 300.

The first control signal SCS may include scan start pulses and clock signals. A scan start pulse may control a first timing of a scan signal. The clock signals may be used to shift the scan start pulses.

The second control signal CCS may include control start pulses and clock signals. A control start pulse may control a first timing of a control signal. The clock signals may be used to shift the control start pulses.

The third control signal DCS may include source start pulses and clock signals. A source start pulse may control a sampling start time point of data. The clock signals may be used to control a sampling operation.

The fourth control signal SECS may include start pulses and clock signals of selection signals.

The scan driver 200 may receive the first control signal SCS from the timing controller 500 and may supply scan signals to the scan lines SL based on the first control signal SCS. For example, the scan driver 200 may sequentially supply the scan signals to the scan lines SL. In case that the scan signals may be sequentially supplied, the pixels PXL may be selected in a horizontal line part (or a pixel row part).

The scan driver 200 may receive the second control signal CCS from the timing controller 500 and may supply control signals to the control lines CL based on the second control signal CCS. For example, the scan driver 200 may sequentially supply the control signals to the control lines CL. Here, the control signals may be signals for controlling operations of the selection circuits included in the pixel PXL.

In an embodiment, the scan driver 200 may have separate circuit configurations for outputting a scan signal and a control signal.

The data driver 300 may receive the third control signal DCS and the image data DATA from the timing controller 500. The data driver 300 may supply data signals to the data lines DL in response to the third control signal DCS. The data signals supplied to the data lines DL may be supplied to the pixels PXL selected by the scan signals. To this end, the data driver 300 may supply the data signals to the data lines DL so as to be synchronized with the scan signals.

The selection signal driver 400 may supply a first selection signal to the pixels PXL through first selection signal lines SEL1 and may supply a second selection signal to the pixels PXL through second selection signal lines SEL2. The first selection signal may be a signal for electrically connecting the first pixel circuit and the light-emitting elements included in the pixel PXL, and the second selection signal may be a signal for electrically connecting the second pixel circuit and the light-emitting elements. The first and second selection signals may be supplied to the pixels PXL selected by the control signals.

For example, the scan lines SL and the control lines CL may be connected to the pixels PXL in a pixel row part. The data lines DL, the first selection signal lines SEL1, and the second selection signal lines SEL2 may be connected to the pixels PXL in a pixel column part.

In an embodiment, the second selection signal may be an inversion signal of the first selection signal. Therefore, in one pixel PXL, one of the first and second pixel circuits may be electrically connected to the light-emitting elements by the first and second selection signals.

In an embodiment, the display device 1000 may further include an emission driver configured to supply an emission control signal to the pixel PXL and/or a power supply configured to supply power sources VDD and VSS to the pixel PXL.

FIGS. 2A, 2B, 3A, 3B, 4A, and 4B are schematic perspective views and schematic cross-sectional views illustrating examples of a light-emitting element that may be included in the pixel of the display device of FIG. 1.

Rod-shaped light-emitting elements LD having a circular columnar shape are illustrated in FIGS. 2A to 4B, but the type and/or shape of the light-emitting elements LD are not limited thereto.

Figure 2A:
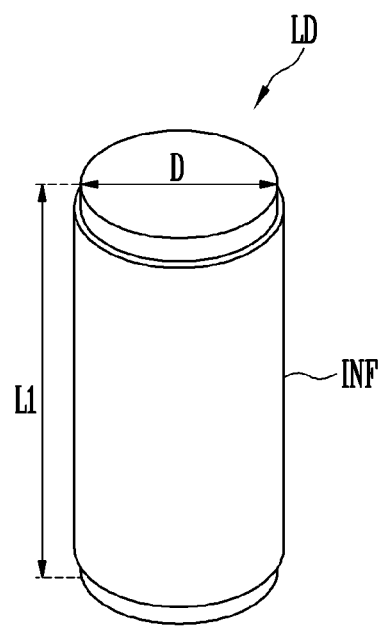
FIGS. 2A and 2B are a schematic perspective view and a schematic cross-sectional view illustrating a light-emitting element according to an embodiment.
Figure 2B:
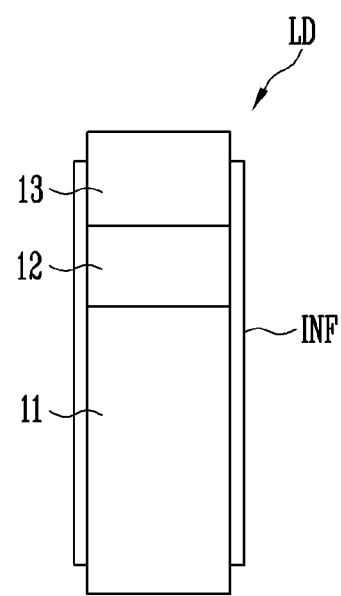

First, referring to FIGS. 2A and 2B, a light-emitting element LD according to an embodiment may include a first semiconductor layer 11, a second semiconductor layer 13, and an active layer 12 interposed between the first semiconductor layer 11 and the second semiconductor layer 13. In an example, the light-emitting element LD may be formed as a stacked body in which the first semiconductor layer 11, the active layer 12, and the second semiconductor layer 13 may be stacked (e.g., sequentially stacked) in a direction of a length L1.

According to an embodiment, the light-emitting element LD may be provided in a rod shape extending in a direction. In case that it is considered that an extending direction of the light-emitting element LD may be the direction of the length L1, the light-emitting element LD may have one end portion and the other end portion in the direction of the length L1.

According to an embodiment, one of the first and second semiconductor layers 11 and 13 may be disposed at an end portion of the light-emitting element LD, and another of the first and second semiconductor layers 11 and 13 may be disposed at the other end portion of the light-emitting element LD.

According to embodiments, the light-emitting element LD may be a rod-shaped light-emitting diode manufactured in a rod shape. In the specification, the term "rod shape" may include a rod-like shape and a bar-like shape, such as a circular column and a polygonal column, which may be long in the direction of the length L1 (i.e., have an aspect ratio greater than one). A shape of a cross section of the rod shape is not particularly limited. For example, the length L1 of the light-emitting element LD may be greater than a diameter D (or a width of a cross section) thereof.

According to an embodiment, the light-emitting element LD may have a small size ranging from a nanoscale to a microscale. The light-emitting element LD may have a diameter D and/or a length L1, which may range from a nanoscale to a microscale. For example, the length L1 of the light-emitting element LD may be in a range of about 100 nm to about 10 μm, and an aspect ratio of the light-emitting element LD may be in a range of about 1.2 to about 100. However, the size of the light-emitting element LD is not limited thereto. For example, the size of the light-emitting element LD may be variously changed according to design conditions of various devices such as a display device which uses a light-emitting device including the light-emitting element LD as a light source.

In an example, the first semiconductor layer 11 may include an n-type semiconductor layer. For example, the first semiconductor layer 11 may include an n-type semiconductor layer which may include a semiconductor material selected from InAlGaN, GaN, AlGaN, InGaN, AlN, and InN and may be doped with a first conductive type dopant such as silicon (Si), germanium (Ge), or tin (Sn). However, the material constituting the first semiconductor layer 11 is not limited thereto, and the first semiconductor layer 11 may also be made of various materials. The active layer 12 may be disposed on the first semiconductor layer 11 and may be formed to have a single or multi-quantum well structure. In an embodiment, a clad layer (not shown) doped with a conductive dopant may be formed on and/or below the active layer 12. In an example, the clad layer may be formed as an AlGaN layer or an InAlGaN layer. According to an embodiment, a material such as AlGaN or InAlGaN may be used to form the active layer 12. The active layer 12 may also be made of various materials.

When a voltage greater than or equal to a threshold voltage may be applied to both ends of the light-emitting element LD, electrons and holes may be combined with each other, and thus, the light-emitting element LD emits light. By controlling light emission of the light-emitting element LD using such a principle, the light-emitting element LD may be used as a light source of various light-emitting devices including the pixels of the display device.

The second semiconductor layer 13 may be disposed on the active layer 12 and may include a semiconductor layer having a type different from that of the first semiconductor layer 11. For example, the second semiconductor layer 13 may include a p-type semiconductor layer. For example, the second semiconductor layer 13 may include a p-type semiconductor layer which may include a semiconductor material selected from InAlGaN, GaN, AlGaN, InGaN, AlN, and InN and may be doped with a second conductive type dopant such as magnesium (Mg). However, the material constituting the second semiconductor layer 13 is not limited thereto, and the second semiconductor layer 13 may be made of various materials.

According to an embodiment, the light-emitting element LD may further include an insulating film INF provided on a surface thereof. The insulating film INF may be formed on the surface of the light-emitting element LD so as to surround an outer circumferential surface of the active layer 12. The insulating film INF may further surround a region of each of the first and second semiconductor layers 11 and 13. However, the insulating film INF may expose both ends of the light-emitting element LD. The ends of the light-emitting element LD may have different polarities. For example, the insulating film INF may not cover and may expose an end of each of the first and second semiconductor layers 11 and 13 disposed at both ends of the light-emitting element LD in the direction of the length L1. For example, two base sides of a circular column (e.g., an upper surface and a lower surface of the light-emitting element LD in FIGS. 2A and 2B) may be exposed.

According to an embodiment, the insulating film INF may include at least one insulating material selected from $SiO_2$, $Si_3N_4$, $Al_2O_3$, and $TiO_2$, but the invention is not limited thereto. The structural material of the insulating film INF is not particularly limited, and the insulating film INF may be made of various insulating materials which may be currently known.

In an embodiment, the light-emitting element LD may include an additional component in addition to the first semiconductor layer 11, the active layer 12, the second semiconductor layer 13, and/or the insulating film INF. For example, the light-emitting element LD may additionally include at least one fluorescent layer, active layer, semiconductor layer, and/or electrode layer disposed at one end side of the first semiconductor layer 11, the active layer 12, and/or the second semiconductor layer 13.

Figure 3A:
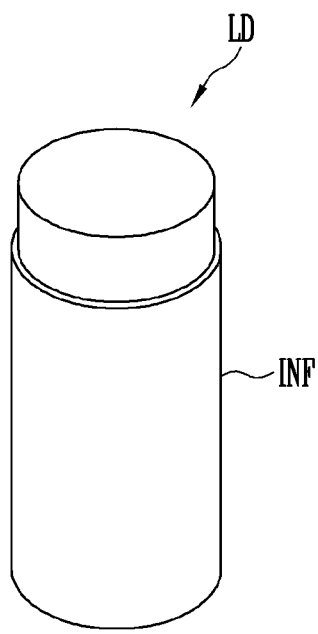
FIGS. 3A and 3B are a schematic perspective view and a schematic cross-sectional view illustrating a light-emitting element according to an embodiment.
Figure 3B:
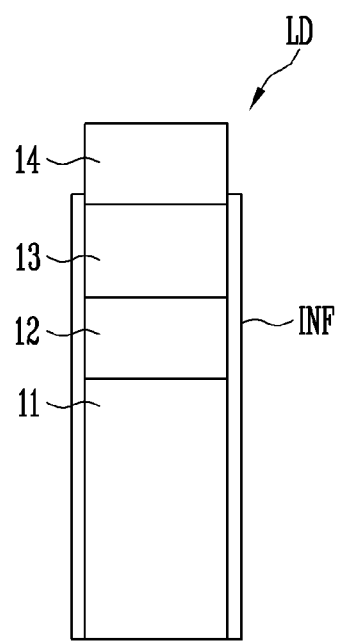
Figure 4A:
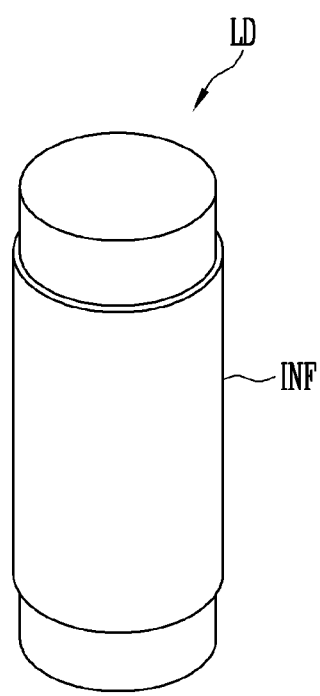

For example, as shown in FIGS. 3A and 3B, the light-emitting element LD may further include at least one electrode layer 14 disposed at an end side of the second semiconductor layer 13. According to an embodiment, as shown in FIGS. 4A and 4B, the light-emitting element LD may further include another electrode layer 15 disposed at an end side of the first semiconductor layer 11.

Each of the electrode layers 14 and 15 may be an ohmic contact electrode but the electrode layers 14 and 15 are not limited thereto. For example, the electrode layers 14 and 15 may be schottky contact electrodes. The electrode layers 14 and 15 may include a metal or a metal oxide. For example, chromium (Cr), titanium (Ti), aluminum (Al), gold (Au), nickel (Ni), indium tin oxide (ITO), indium zinc oxide (IZO), indium tin zinc oxide (ITZO), and oxides or alloys thereof may be used alone or in a mixture thereof. The electrode layers 14 and 15 may be substantially transparent or semi-transparent. Accordingly, light generated in the light-emitting element LD may pass through the electrode layers 14 and 15 and may be emitted outside of the light-emitting element LD.

According to an embodiment, the insulating film INF may or may not surround at least a portion of an outer circumferential surface of each of the electrode layers 14 and 15. For example, the insulating film INF may be selectively formed on a surface of each of the electrode layers 14 and 15. The insulating film INF may be formed to expose both ends of the light-emitting element LD. The ends of the light-emitting element LD may have different polarities. For example, the insulating film INF may expose at least one region of each of the electrode layers 14 and 15. In another embodiment, the insulating film INF may not be provided.

When the insulating film INF may be provided on the surface of the light-emitting element LD, in particular, a surface of the active layer 12, it may be possible to prevent the active layer 12 from being short-circuited with an electrode or the like. For example, it may be possible to prevent a short-circuit with a contact electrode of the contact electrodes that may be connected to both ends of the light-emitting element LD. Accordingly, electrical stability of the light-emitting element LD may be secured.

Since the insulating film INF may be formed on the surface of the light-emitting element LD, surface defects of the light-emitting element LD may be minimized, thereby improving a lifetime and efficiency of the light-emitting element LD. In case that the insulating film INF is formed in each of the light-emitting elements LD, an undesirable short circuit may be prevented from occurring between the light-emitting elements LD even in case that the light-emitting elements LD may be disposed close to each other.

The light-emitting element LD may be manufactured through a surface treatment process. For example, in case that the light-emitting elements LD are mixed in a flowable solution (or a solvent) and provided to each emission region (for example, an emission region of each pixel), the light-emitting elements LD may each be surface-treated so as to be uniformly dispersed without being non-uniformly aggregated in the solution.

A light-emitting device including the light-emitting element LD may be used in various types of devices that may have a display device, which require a light source. For example, one or more light-emitting elements LD (for example, the light-emitting elements LD each having a size ranging from a nanoscale to a microscale) may be disposed in each pixel region of a display panel, thereby constituting a light source (or, a light source part). However, application of a light-emitting element LD is not limited to a display device. For example, the light-emitting element LD may be used in other types of devices, such as a lighting device, which require a light source.

FIG. 5 is a schematic plan view illustrating an example of the display device of FIG. 1.

Display panel PNL, which may be included in a display device, is shown as an example of a device which may use the light-emitting elements LD described with reference to FIGS. 2A to 4B as a light source. In an example, pixels PXL of the display panel PNL may include light-emitting elements LD.

For convenience, the structure of the display panel PNL is briefly shown in FIG. 5 with respect to a display region DA. However, according to an embodiment, at least one driving circuit (for example, at least one scan driver) and/or wires, which are not shown, may be further disposed in the display panel PNL.

Referring to FIG. 5, the display panel PNL according to an embodiment may include a base layer BSL and pixels PXL disposed on the base layer BSL. Specifically, the display panel PNL and the base layer BSL for forming the display panel PNL may include a display region DA for displaying an image and a non-display region NDA excluding the display region DA. The pixels PXL may be disposed in the display region DA of the base layer BSL.

According to an embodiment, the display region DA may be disposed in a central region of the display panel PNL, and the non-display region NDA may be disposed in an edge region of the display panel PNL so as to surround the display region DA. However, the positions of the display region DA and the non-display region NDA are not limited thereto and may be changed. The display region DA may constitute a screen on which an image may be displayed.

The base layer BSL may constitute a base member of the display panel PNL. According to an embodiment, the base layer BSL may be a rigid or flexible substrate or film, and the material or physical properties thereof are not particularly limited. In an example, the base layer BSL may be a rigid substrate made of glass or tempered glass, a flexible substrate (or a thin film) made of a plastic or metal material, or an insulating film including at least one layer. The material and/or physical properties of the base layer BSL are not particularly limited.

The base layer BSL may be transparent but is not limited thereto. In an example, the base layer BSL may be a transparent, non-transparent, opaque, or reflective base member.

One region of the base layer BSL may be defined as the display region DA, and thus, the pixels PXL may be disposed therein. The remaining region of the base layer BSL may be defined as the non-display region NDA. For example, the base layer BSL may include the display region DA including pixel regions in which the pixels PXL may be formed, and the non-display region NDA disposed at a periphery of the display region DA. Various wirings and/or embedded circuits connected to the pixels PXL of the display region DA may be disposed in the non-display region NDA.

According to an embodiment, the pixels PXL may be distributed and disposed in the display region DA. In an example, the pixels PXL may be arranged in the display region DA in a stripe or pentile array structure. However, the invention is not limited thereto. For example, the pixels PXL may be arranged in the display region DA in various array structures which may be currently known.

Figure 6:
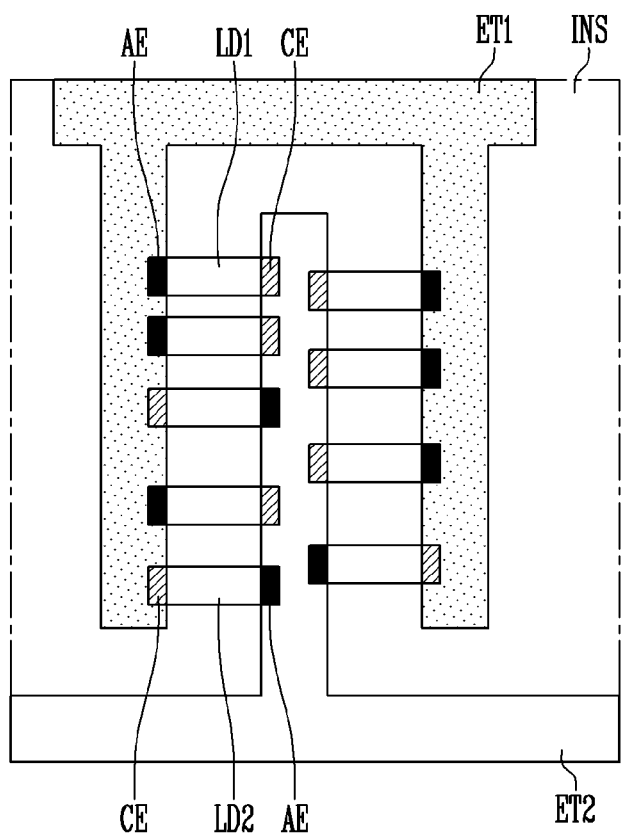
FIG. 6 is a schematic diagram illustrating light-emitting elements in a pixel according to an embodiment.

FIG. 6 is a schematic diagram illustrating the light-emitting elements according to an embodiment. The light emitting elements may be aligned in the pixel.

Referring to FIG. 6, the pixel PXL may include a first electrode ET1, a second electrode ET2, and light-emitting elements LD1 and LD2.

As described with reference to FIGS. 2A through 4B, in an embodiment, each of the light-emitting elements LD1 and LD2 may be a diode element. For example, one electrode layer of each of the light-emitting elements LD1 and LD2 may be an anode electrode AE, and the other electrode layer thereof may be a cathode electrode CE.

The first electrode ET1 and the second electrode ET2 may be disposed on an insulating layer INS. Pixel circuits, selection circuits, and wires for driving the pixels PXL may be formed and disposed below the insulating layer INS. The pixel circuits and the selection circuits may be electrically connected to the first electrode ET1 or the second electrode ET2 through contact holes that may pass through the insulating layer INS.

The first electrode ET1 and the second electrode ET2 may be spaced apart from each other. In general, a voltage of a first power source (VDD of FIG. 1) having a high potential may be supplied to the first electrode ET1, and a voltage of a second power source (VSS of FIG. 1) having a low potential may be supplied to the second electrode ET2.

In an embodiment, the light-emitting elements LD1 and LD2 may be provided in the display part 100 in which the first and second electrodes ET1 and ET2 may be disposed. For example, the light-emitting elements LD1 and LD2 may be formed in a form dispersed in a solution and thus may be provided on the first and second electrodes ET1 and ET2 using an inkjet method or the like. In case that an alignment voltage (or an alignment signal) applied to the first and second electrodes ET1 and ET2, while an electric field may be formed between the first electrode ET1 and the second electrode ET2, the light-emitting elements LD1 and LD2 may be aligned between the first electrode ET1 and the second electrode ET2. After the light-emitting elements LD1 and LD2 are aligned, the solvent may be volatilized or be removed through other methods to stably align the light-emitting elements LD1 and LD2 between the first electrode ET1 and the second electrode ET2.

However, polar directions of the light-emitting elements LD1 and LD2 may be randomly determined according to a probability distribution (for example, a Gaussian probability distribution). For example, as shown in FIG. 6, the light-emitting elements LD1 and LD2 may include a first polarity direction light-emitting element LD1 and a second polarity direction light-emitting element LD2.

The first polarity direction light-emitting element LD1 may be a light-emitting element connected in a forward direction. For example, the anode electrode AE of the first polarity direction light-emitting element LD1 may be electrically connected to the first electrode ET1, and the cathode electrode CE thereof may be electrically connected to the second electrode ET2. FIG. 6 illustrates that the anode/cathode electrodes AE and CE of the light-emitting elements LD1 and LD2 may be in direct contact with the first/second electrodes ET1 and ET2, but the invention is not limited thereto. The anode/cathode electrodes AE and CE and the first/second electrodes ET1 and ET2 may also be connected through another conductive layer or conductive material.

The second polarity direction light-emitting element LD2 may be a light-emitting element connected in a reverse direction. For example, the anode electrode AE of the second polarity direction light-emitting element LD2 may be electrically connected to the second electrode ET2, and the cathode electrode CE thereof may be electrically connected to the first electrode ET1. Therefore, the second polarity direction light-emitting element LD2 may not emit light.

The light-emitting elements LD1 and LD2 may be randomly aligned, and a ratio of the first polarity direction light-emitting elements LD1 and the second polarity direction light-emitting element LD2 may be different for each pixel PXL. For example, as shown in FIG. 6, four first polarity direction light-emitting elements LD1 and five second polarity direction light-emitting elements LD2 may be disposed in the pixel PXL. The light-emitting elements LD1 and LD2 may be disposed in other pixels PXL in different ratios or numbers. Such an alignment deviation may cause a luminance deviation of the display device 1000. For example, in case that only the second polarity direction light-emitting elements LD2 are included in one pixel PXL, the pixel PXL may not emit light and may be viewed as a dark spot.

As a ratio of the second polarity direction light-emitting element LD2 in the pixel PXL may be increased, a drain voltage of a driving transistor of the pixel PXL may be increased, and thus, the driving transistor may be driven in a linear region. Accordingly, luminance may be lowered.

In order to solve a problem in that the driving transistor may be driven in the linear region, a large voltage difference may be applied between the voltage of the first power source VDD and the voltage of the second power source VSS. For example, the voltage difference may be set to about 80 V or more. A probability that the driving transistor may be driven in a saturation region may be increased regardless of the number or ratio of the second polarity direction light-emitting elements LD2. However, due to the very large voltage difference between the voltage of the first power source VDD and the voltage of the second power source VSS, power consumption and heat generation may be increased.

In order to solve the problems, in the pixel according to an embodiment, a circuit configuration that may be connected to the first and second electrodes ET1 and ET2 may differ and may be determined according to a polarity ratio of the light-emitting elements LD1 and LD2.

Figure 7:
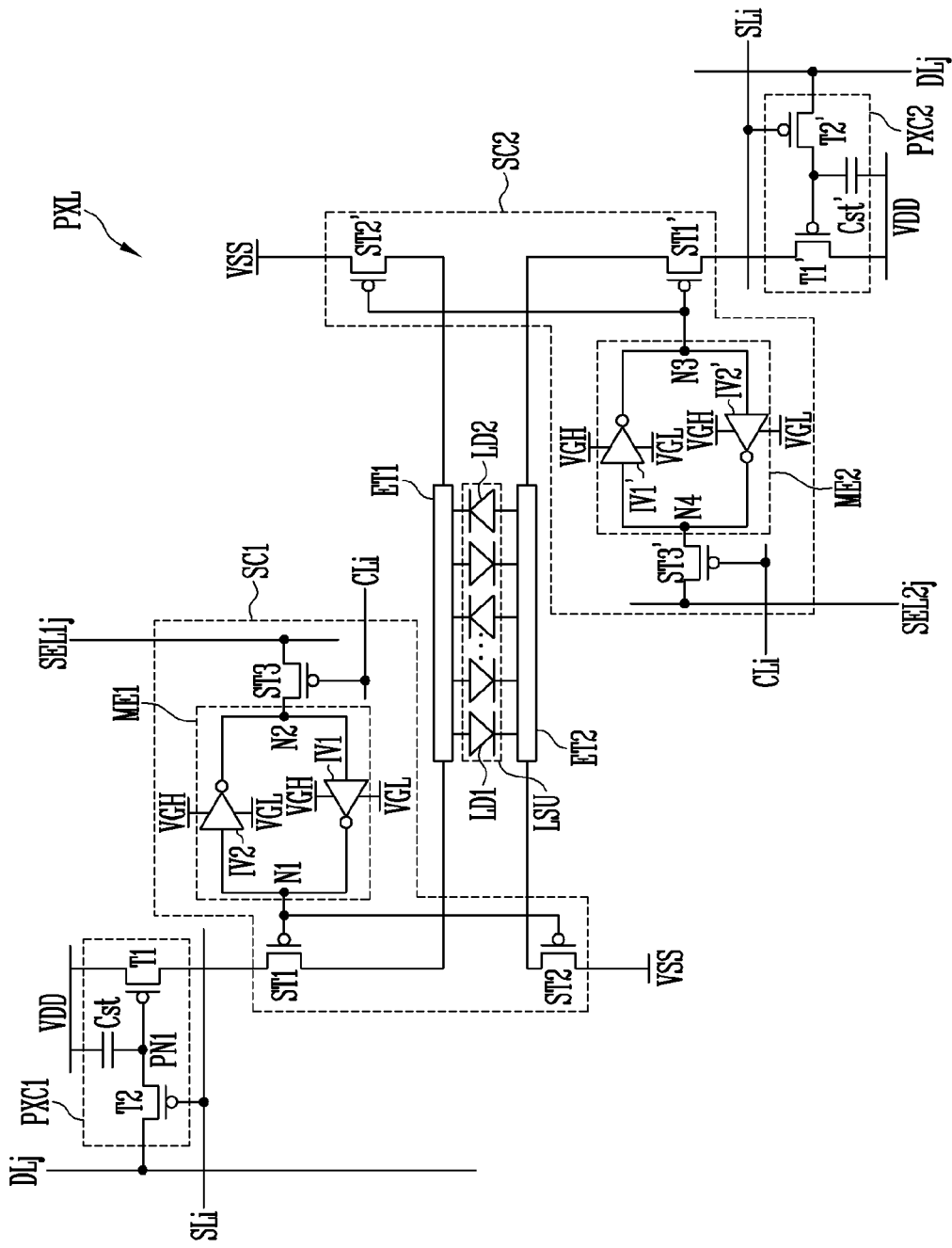
FIG. 7 is a schematic diagram illustrating a pixel according to an embodiment.

FIG. 7 is a schematic diagram illustrating a pixel according to an embodiment.

Referring to FIGS. 1 and 7, a pixel PXL may include a first electrode ET1, a second electrode ET2, light-emitting elements LD1 and LD2, a first pixel circuit PXC1, a first selection circuit SC1, a second pixel circuit PXC2, and a second selection circuit SC2.

The light-emitting elements LD1 and LD2 may be defined as one light source part LSU. For example, the light source part LSU included in the pixel PXL may include light-emitting elements LD1 and LD2. In an embodiment, the light-emitting elements LD1 and LD2 may be connected in parallel with each other, but the invention is not limited thereto. For example, in another embodiment, the light-emitting elements LD1 and LD2 may be connected in a series-parallel mixed structure between the first electrode ET1 and the second electrode ET2. In addition, the numbers and ratios of first polarity direction light-emitting elements LD1 and second polarity direction light-emitting elements LD2 included in the light source part LSU may be randomly determined.

In an embodiment, the first pixel circuit PXC1 and the second pixel circuit PXC2 may be formed to be connected to one light source part LSU and may have substantially the same structure. One of the first pixel circuit PXC1 and the second pixel circuit PXC2 may be electrically connected to the light source part LSU.

First and second power sources VDD and VSS may have different potentials such that the light-emitting elements LD emit light. In an example, the first power source VDD may be set as a high potential power source, and the second power source VSS may be set as a low potential power source. A potential difference between the first power source VDD and the second power source VSS may be set to be greater than or equal to a threshold voltage of the light-emitting elements LD during an emission period of the pixel PXL.

The first and second pixel circuits PXC1 and PXC2 may be connected to a scan line SLi and a data line DLj of the pixel PXL. In an example, in case that the pixel PXL is disposed in an $i^{th}$ row and a $j^{th}$ column (where i and j may be natural numbers), the first pixel circuit PXC1 and the second pixel circuit PXC2 may be connected to an $i^{th}$ scan line SLi and a $j^{th}$ data line DLj.

According to an embodiment, the first pixel circuit PXC1 may include first and second transistors T1 and T2 and a storage capacitor Cst.

The first transistor T1 (also referred to as a "driving transistor") may be connected between the first power source VDD and the light source part LSU. A gate electrode of the first transistor T1 may be connected to a first pixel node PN1. The first transistor T1 may control a driving current supplied to the light source part LSU in response to a voltage of the first pixel node PN1.

In an embodiment, one electrode (for example, a source electrode) of the first transistor T1 may be connected to the first selection circuit SC1.

The second transistor T2 (also referred to as a "switching transistor") may be connected between the data line DLj and the first pixel node PN1. A gate electrode of the second transistor T2 may be connected to the scan line SLi. In case that a scan signal may be supplied, the second transistor T2 may be turned on to electrically connect the data line DLj and the first pixel node PN1.

The storage capacitor Cst may be charged with a voltage corresponding to a data signal. One electrode of the storage capacitor Cst may be connected to the first power source VDD, and the other electrode thereof may be connected to the first pixel node PN1. The storage capacitor Cst may be charged with the voltage corresponding to the data signal supplied to the first pixel node PN1 during each frame period.

In an embodiment, the second pixel circuit PXC2 may include first and second transistors T1' and T2' and a storage capacitor Cst'. A configuration of the second pixel circuit PXC2 may be substantially the same as that of the first pixel circuit PXC1. Thus, redundant descriptions are omitted.

The first selection circuit SC1 may be connected to a control line CLi and a first selection signal line SEL1j of the pixel PXL. In an example, the first selection circuit SC1 of the pixel PXL may be connected to an $i^{th}$ control line CLi and a $j^{th}$ first selection signal line SEL1j.

The second selection circuit SC2 may be connected to the control line CLi and a second selection signal line SEL2j of the pixel PXL. In an example, the second selection circuit SC2 of the pixel PXL may be connected to the $i^{th}$ control line CLi and a $j^{th}$ second selection signal line SEL2j.

The first selection circuit SC1 may control an electrical connection between the first pixel circuit PXC1 and the first electrode ET1 and an electrical connection between the second power source VSS and the second electrode ET2 based on a first selection signal.

In embodiments, the first selection circuit SC1 may include a first selection transistor ST1, a second selection transistor ST2, a third selection transistor ST3, and a memory element ME1. The first selection circuit SC1 may be formed below the light source part LSU of a display region together with the first pixel circuit PXC1.

The first selection transistor ST1 may be connected between the first pixel circuit PXC1 and the first electrode ET1. A gate electrode of the first selection transistor ST1 may be connected to a first node N1. The first selection transistor ST1 may electrically connect the first transistor T1 and the first electrode ET1 in response to a voltage applied to the gate electrode thereof.

The second selection transistor ST2 may be connected between the second electrode ET2 and the second power source VSS. A gate electrode of the second selection transistor ST2 may be connected to the first node N1. The second selection transistor ST2 may electrically connect the second electrode ET2 and the second power source VSS in response to a voltage applied to the gate electrode thereof.

The third selection transistor ST3 may be connected between a first selection signal line SEL1j and a second node N2. A gate electrode of the third selection transistor ST3 may be connected to the control line CLi for supplying a control signal. In case that a control signal having a gate-on voltage may be supplied to the control line CLi, the third selection transistor ST3 may be turned on to transmit a first selection signal of the first selection line SEL1j to the second node N2 (i.e., the memory element ME1).

The memory element ME1 may be connected between the first node N1 and the second node N2. In an embodiment, the memory element ME1 may include a first inverter IV1 and a second inverter IV2 which may be mutually feedback-connected between the first node N1 and the second node N2. As shown in FIG. 7, for example, the first inverter IV1 and the second inverter IV2 are connected with each other such that an output of the first inverter IV1 is inputted to the second inverter IV2, and on output of the second inverter IV2 is inputted to the first inverter IV1.

The first inverter IV1 may be driven by being connected to a high power source VGH and a low power source VGL and may invert a signal of the second node N2 to supply the inverted signal to the first node N1. The second inverter IV2 may be driven by being connected to the high power source VGH and the low power source VGL and may invert a signal of the first node N1 to supply the inverted signal to the second node N2. Therefore, in case that the third selection transistor ST3 is turned on and a logic low level voltage is supplied to the second node N2, a logic high level voltage may be supplied to the first node N1. In case that the third selection transistor ST3 turned on and a logic high level voltage supplied to the second node N2, a logic low level voltage may be supplied to the first node N1.

In an embodiment, a configuration of the first and second inverters IV1 and IV2 may perform a memory function. Therefore, due to mutual feedback between the first inverter IV1 and the second inverter IV2, an inverted signal of the first selection signal supplied to the second node N2 may be continuously supplied to the first node N1. Until the supplies of voltages of the high power source VGH and the low power source VGL may be cut off, a voltage level of the inverted signal of the first selection signal may be maintained at the first node N1.

For example, in case that the first selection signal having a logic high level is supplied to the second node N2, a logic low level voltage may be supplied to the gate electrodes of the first and second selection transistors ST1 and ST2. Thus, the first pixel circuit PXC1 may be connected to the first electrode ET1, and the second power source VSS may be connected to the second electrode ET2. Accordingly, the first polarity direction light-emitting elements LD1 may emit light normally.

For example, in case that the first pixel circuit PXC1 is selected by the first selection circuit SC1, the light source part LSU may emit light by a driving current generated by the first pixel circuit PXC1.

The second selection circuit SC2 may control an electrical connection between the second pixel circuit PXC2 and the second electrode ET2 and an electrical connection between the second power source VSS and the first electrode ET1.

Like the first selection circuit SC1, the second selection circuit SC2 may include a first selection transistor ST1', a second selection transistor ST2', a third selection transistor ST3', and a memory element ME2.

The first selection transistor ST1' may be connected between the second pixel circuit PXC2 and the second electrode ET2. A gate electrode of the first selection transistor ST1' may be connected to a third node N3. The first selection transistor ST1' may electrically connect the first transistor T1' and the second electrode ET2 in response to a voltage applied to the gate electrode thereof.

The second selection transistor ST2' may be connected between the first electrode ET1 and the second power source VSS. A gate electrode of the second selection transistor ST2' may be connected to the third node N3. The second selection transistor ST2' may electrically connect the first electrode ET1 and the second power source VSS in response to a voltage applied to the gate electrode thereof.

The third selection transistor ST3' may be connected between a second selection signal line SEL2$j$ and a fourth node N4. A gate electrode of the third selection transistor ST3' may be connected to the control line CLi for supplying a control signal. In case that a control signal having a gate-on voltage may be supplied to the control line CLi, the third selection transistor ST3' may be turned on to transmit a second selection signal of the second selection signal line SEL2$j$ to the fourth node N4 (i.e., the memory element ME2).

The memory element ME2 may be connected between the third node N3 and the fourth node N4. In an embodiment, the memory element ME2 may include a first inverter IV1' and a second inverter IV2' which may be mutually feedback-connected between the third node N3 and the fourth node N4.

Since the configurations and operation methods of the second selection circuit SC2 and the first selection circuit SC1 may be substantially the same, redundant descriptions thereof will be omitted.

According to an embodiment, in case that the second selection signal having a logic high level is supplied to the fourth node N4, a logic low level voltage may be supplied to the gate electrodes of the first and second selection transistors ST1' and ST2'. Thus, the second pixel circuit PXC2 may be connected to the second electrode ET2, and the second power source VSS may be connected to the first electrode ET1.

For example, voltages applied to the first and second electrodes ET1 and ET2 may be changed. Accordingly, the second polarity direction light-emitting elements LD2 may emit light normally.

For example, in case that the second pixel circuit PXC2 is selected by the second selection circuit SC2, the light source part LSU may emit light by a driving current generated by the second pixel circuit PXC2.

The first selection circuit SC1 and the second selection circuit SC2 may be operated complementarily. For example, in case that a logic low level voltage is supplied to the first node N1, a logic high level voltage may be supplied to the third node N3. In case that a logic high level voltage may be supplied to the first node N1, a logic low level voltage may be supplied to the third node N3. Therefore, in case that the first pixel circuit PXC1 is electrically connected to the light source part LSU, the second pixel circuit PXC2 may be not used. On the contrary, in case that the second pixel circuit PXC2 is electrically connected to the light source part LSU, the first pixel circuit PXC1 may be not used.

All transistors are illustrated in FIG. 7 as being PMOS transistors, but the invention is not limited thereto. At least some of the transistors may be replaced by NMOS transistors.

Figure 8:
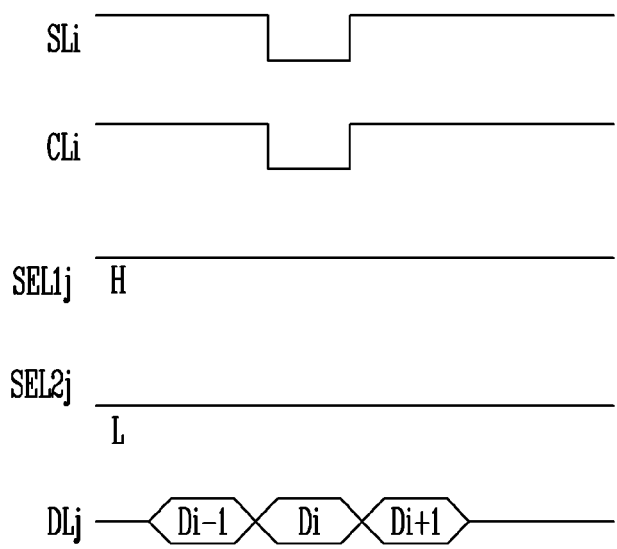
FIG. 8 is a schematic graphical view of signal waveforms to explain an operation of a pixel according to an embodiment.

FIG. 8 is a schematic graphical view of signal waveforms to explain an operation of a pixel according to an embodiment, for example, the pixel of FIG. 7.

Referring to FIGS. 7 and 8, the pixel PXL disposed in the i$^{th}$ row and the j$^{th}$ column may be connected to the i$^{th}$ scan line SLi, the i$^{th}$ control line CLi, the j$^{th}$ data line DLj, the j$^{th}$ first selection signal line SEL1$j$, and the j$^{th}$ second selection signal line SEL2$j$.

In an embodiment, the timing diagram of FIG. 8 corresponds to a case in which the number of the first polarity direction light-emitting elements LD1 included in the light source part LSU may be greater than the number of the second polarity direction light-emitting elements LD2. Therefore, the first selection signal that may be supplied to the pixel PXL has a logic high level H, and the second selection signal has a logic low level L.

However, this is merely an example, and in case that the first pixel circuit PXC1 is selected, the first selection signal may have a gate-off level for turning off the first selection transistor ST1. For example, in case that the first selection transistor ST1 is an NMOS transistor, the first selection signal may have a logic low level.

In an embodiment, the scan signal and the control signal may be supplied to the pixel PXL at substantially the same timing. However, this is merely an example, and the timing of supplying the scan signal and the control signal is not limited thereto.

A data signal Di corresponding to the pixel PXL may be synchronized with the scan signal supplied to the scan line SLi and be supplied.

When the scan signal may be supplied to the scan line SLi, the second transistors T2 and T2' of the first and second pixel circuits PXC1 and PXC2 may be turned on, and the data signal Di may be supplied to each of the first and second pixel circuits PXC1 and PXC2.

When the control signal may be supplied to the control line CLi, the third selection transistors ST3 and ST3' of the first and second select circuits SC1 and SC2 may be turned on. The first selection signal having the logic high level H may be supplied to the second node N2, and the second selection signal having the logic low level L may be supplied to the fourth node N4.

The logic low level L may be supplied to the first node N1 by an operation of the first memory element ME1, and the first and second selection transistors ST1 and ST2 of the first selection circuit SC1 may be turned on. Thus, the first pixel circuit PXC1 may be connected to the first electrode ET1, and the second power source VSS may be connected to the second electrode ET2. At the same time, the logic high level H may be supplied to the third node N3 by an operation of the memory element ME2, and the first and second selection transistors ST1' and ST2' of the second selection circuit SC2 may be turned off. Therefore, the second pixel circuit PXC2 and the light source part LSU may be disconnected from each other, and the second power source VSS and the first electrode ET1 may also be disconnected from each other.

As a result, the pixel PXL may emit light by driving of the first pixel circuit PXC1 according to a waveform diagram of FIG. 8.

On the contrary, in case that the first selection signal and the second selection signal supplied opposite to FIG. 8, the pixel PXL may emit light by driving of the second pixel circuit PXC2.

Figure 9:
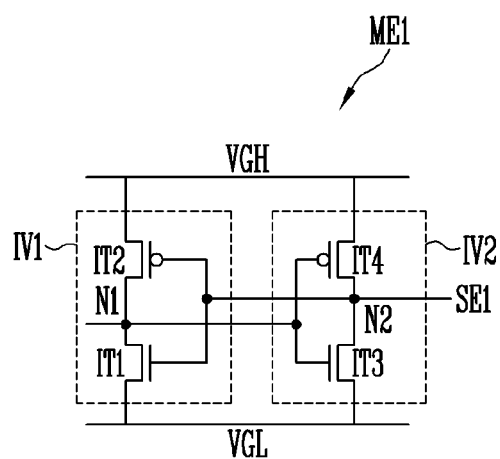
FIG. 9 is a schematic circuit diagram illustrating a memory element according to an embodiment.

FIG. 9 is a schematic circuit diagram illustrating a memory element according to an embodiment, for example, the memory element included in the pixel of FIG. 7.

Referring to FIGS. 7 and 9, a memory element ME1 may include a first inverter IV1 and a second inverter IV2 which may be mutually feedback-connected.

In an embodiment, the memory element ME1 included in a first select circuit SC1 may be disposed between a first node N1 and a third selection transistor ST3 and may determine a voltage of the first node N1 in response to a first selection signal SE1.

The first inverter IV1 may include first and second inverting transistors IT1 and IT2 having different types. The first inverting transistor IT1 may be an NMOS transistor and the second inverting transistor IT2 may be a PMOS transistor.

The first inverting transistor IT1 may be connected between the first node N1 and the low power source VGL. A gate electrode of the first inverting transistor IT1 may be connected to the second node N2. In case that the first inverting transistor IT1 may be turned on, a voltage of a low power source VGL may be supplied to the first node N1.

The second inverting transistor IT2 may be connected between the first node N1 and a high power source VGH. A gate electrode of the second inverting transistor IT2 may be connected to a second node N2. In case that the second inverting transistor IT2 may be turned on, a voltage of the high power source VGH may be supplied to the first node N1.

The second inverter IV2 may include third and fourth inverting transistors IT3 and IT4 having different types. The third inverting transistor IT3 may be an NMOS transistor and the fourth inverting transistor IT4 may be a PMOS transistor.

The third inverting transistor IT3 may be connected between the first node N1 and the low power source VGL. A gate electrode of the third inverting transistor IT3 may be connected to the first node N1. When the third inverting transistor IT3 may be turned on, a voltage of the low power source VGL may be supplied to the second node N2.

The fourth inverting transistor IT4 may be connected between the second node N2 and the high power source VGH. A gate electrode of the fourth inverting transistor IT4 may be connected to the first node N1. In case that the fourth inverting transistor IT4 may be turned on, a voltage of the high power source VGH may be supplied to the second node N2.

The memory element ME1 may store the first selection signal SE1 supplied in response to the control signal. A voltage level corresponding to an inversion signal of the first selection signal SE1 may be continuously supplied to the first node N1. The memory element ME1 may be operated until the supply of power of the high power source VGH and the low power source VGL may be cut off.

Figure 10A:
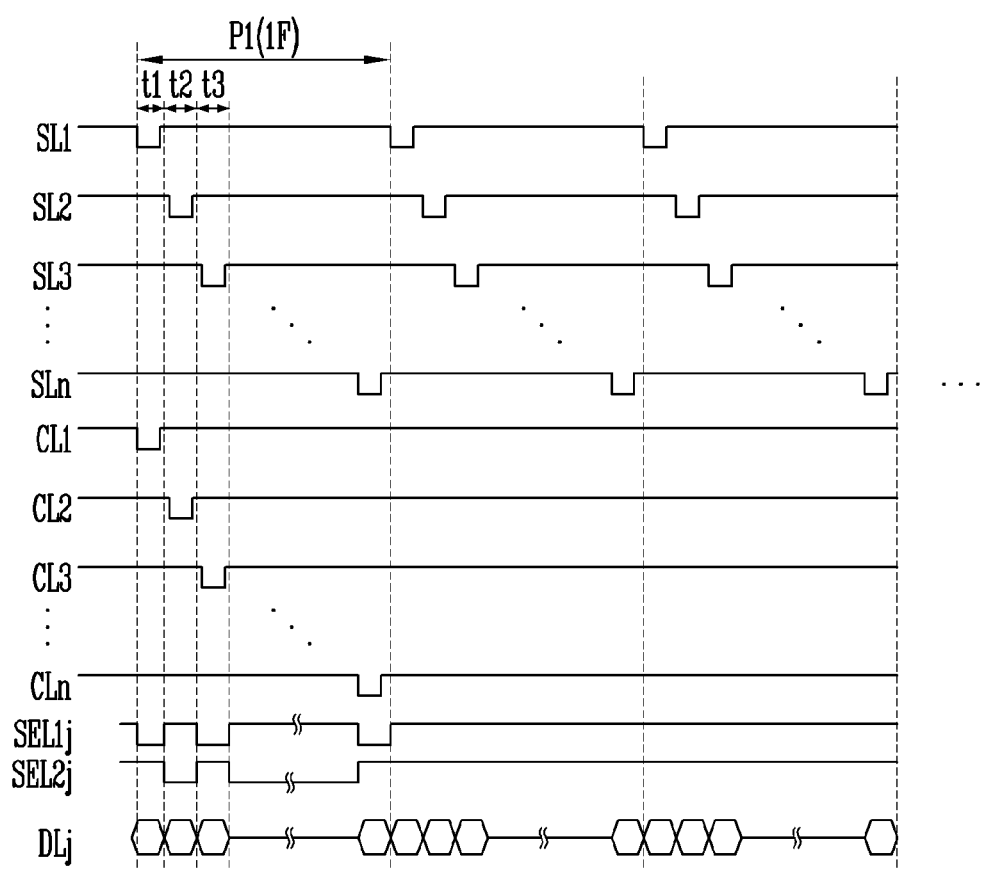
FIG. 10A is a schematic graphical view of signal waveforms to explain an operation of a display device according to an embodiment.
Figure 10B:
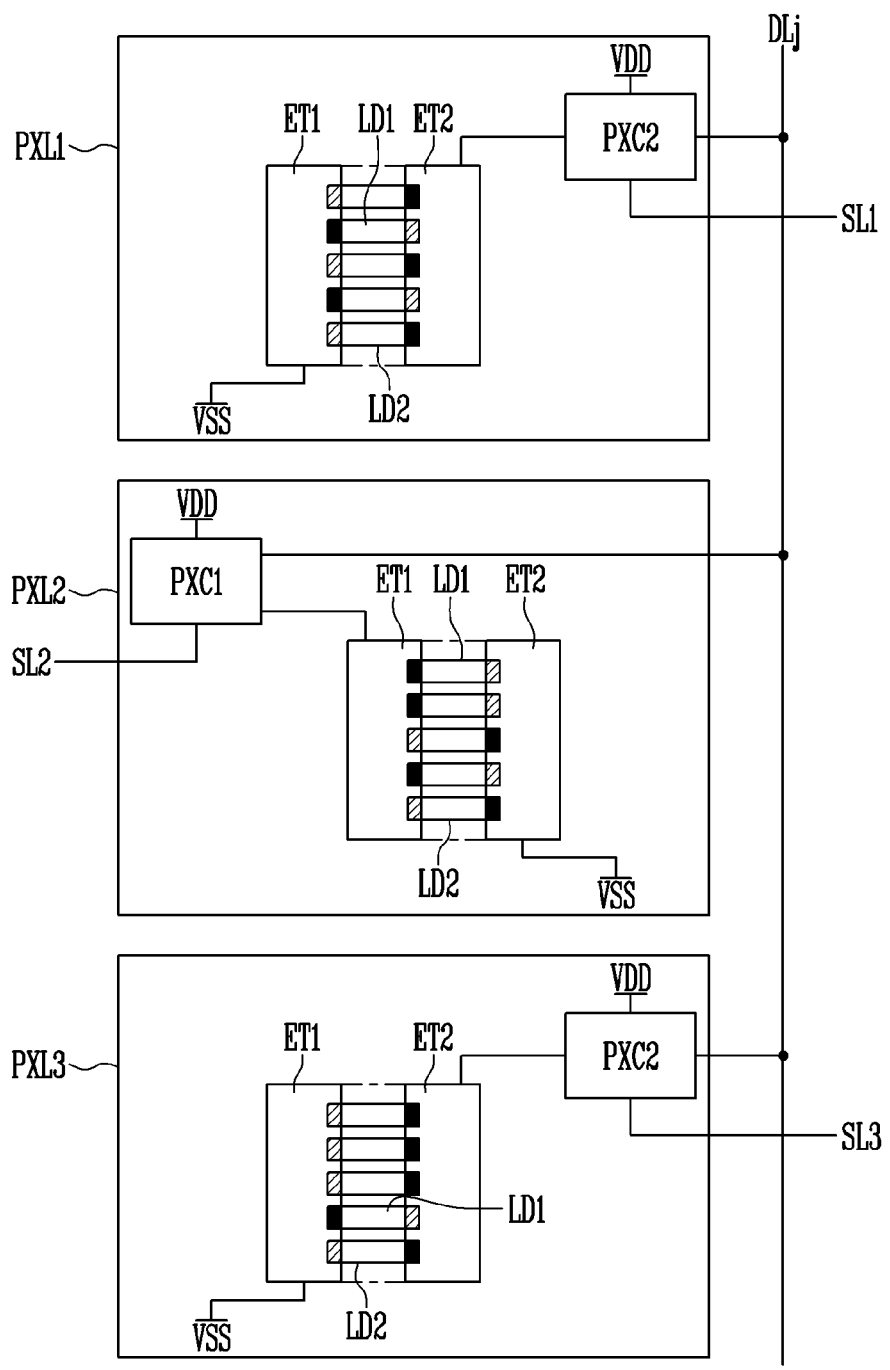
FIG. 10B is a schematic diagram illustrating a connection relationship between pixels according to an embodiment.

FIG. 10A is a schematic graphical view of signal waveforms to explain an operation of a display device according to an embodiment, for example, the display device of FIG. 1 including the pixel of FIG. 7. FIG. 10B is a schematic diagram illustrating a connection relationship between pixels according to an embodiment, for example, some pixels which corresponds to the signal waveforms of FIG. 10A.

Referring to FIGS. 1, 7, 8, 10A, and 10B, scan signals may be sequentially supplied to scan lines SL1 to SLn during a period (or a frame period 1F) wherein n may be a natural number greater than one).

In an embodiment, control signals may be sequentially supplied to control lines CL1 to CLn during a preparation period P1 corresponding to one frame period 1F. According to an embodiment, the control signal may be synchronized with the scan signal and be supplied. The control signal and the scan signal may be output from the same scan driver (see 200 of FIG. 1), for example, the same stage circuits included in the scan driver.

In an embodiment, the preparation period P1 may be included in a wake-up period after a display device may be turned on or in a preparation period before an actual image may be displayed. For example, an image may not be displayed during the preparation period P1.

During the first period P1 during which a first control signal may be supplied, it may be determined which of a first pixel circuit PXC1 and a second pixel circuit PXC2 may be used in each of the pixels PXL.

A first selection signal may be supplied through a first selection signal line SEL1$j$ in a i$^{th}$ column, and a second selection signal may be supplied through a second selection signal line SEL2$j$ in the j$^{th}$ column. Although only the first and second selection signal lines SEL1$j$ and SEL2$j$ corresponding to one pixel column are illustrated in FIG. 10A, the two selection signal lines may be disposed in each pixel column. A waveform supplied to each of selection signal lines may be determined differently according to a ratio of an arrangement direction of light-emitting elements for each pixel.

For example, in a manufacturing process of a display device, an inspection process may be performed of checking the numbers or ratios of first and second polarity direction light-emitting elements LD1 and LD2 included in each light source part LSU. The inspection process may be performed through an optical imaging method, an image analyzing method, or the like.

In one pixel PXL, in case that the number of the first polarity direction light-emitting elements LD1 greater than or equal to the number of the second polarity direction light-emitting elements LD2, the first selection signal corresponding thereto may have a logic high level. The second selection signal may be an inversion signal of the first selection signal and may have a logic low level. Accordingly, the pixel PXL may be driven by the first pixel circuit PXC1. The second pixel circuit PXC2 may not be electrically connected to the light emitting elements.

On the contrary, in case that the number of the first polarity direction light-emitting elements LD1 is less than the number of the second polarity direction light-emitting elements LD2, the first selection signal corresponding thereto may have a logic low level. The second selection signal may be an inversion signal of the first selection signal and may have a logic high level. Accordingly, the pixel PXL may be driven by the second pixel circuit PXC2. The first pixel circuit PXC1 may not be electrically connected to the light emitting elements.

For example, as shown in FIG. 10B, first to third pixels PXL1, PXL2, and PXL3 may have different arrangement ratios of light-emitting elements. The first, second, and third pixels PXL1, PXL2, and PXL3 may be connected to first, second, and third scan lines SL1, SL2, and SL3, respectively.

Second polarity direction light-emitting elements LD2 may be predominantly included in the first pixel PXL1. For example, the first pixel PXL1 may include two first polarity direction light-emitting elements LD1 and three second polarity direction light-emitting elements LD2. During a first time t1, a first selection signal having a logic low level and a second selection signal having a logic high level may be supplied to overlap a control signal supplied to a first control line CL1. Accordingly, the second electrode ET2 may be connected to the second pixel circuit PXC2, and the first electrode ET1 may be connected to the second power source VSS.

The second pixel PXL2 may include three first polarity direction light-emitting elements LD1 and two second polarity direction light-emitting elements LD2. During a second time t2, a first selection signal having a logic high level and a second selection signal having a logic low level may be supplied to overlap a control signal supplied to a second control line CL2. Accordingly, the first electrode ET1 may be connected to the first pixel circuit PXC1, and the second electrode ET2 may be connected to the second power source VSS.

The third pixel PXL3 may include one first polarity direction light-emitting element LD1 and four second polarity direction light-emitting elements LD2. During a third time t3, a first selection signal having a logic low level and a second selection signal having a logic high level may be supplied to overlap a control signal supplied to a third control line CL3. Accordingly, the second electrode ET2 may be connected to the second pixel circuit PXC2, and the first electrode ET1 may be connected to the second power source VSS.

Such pixel circuit selection driving may be sequentially performed in pixel row parts during the frame period 1F. Thereafter, a control signal at which the preparation period P1 ends may maintain a logic high level (or a gate-off level). Therefore, third selection transistors ST3 and ST3' may be in an off-state, and a connection relationship of pixel circuits PXC1 and PXC2 may be maintained by memory elements ME1 and ME2. For example, the driving of the pixel circuit selected once by the memory elements ME1 and ME2 may be continuously maintained.

In FIGS. 10A and 10B, the first and second selection signals have been described as being determined according to the numbers of first and second polarity direction light-emitting elements LD1 and LD2, but the invention is not limited thereto.

In an embodiment, in case that a ratio of the number of the first polarity direction light-emitting elements LD1 to the number of the second polarity direction light-emitting elements LD2 included in the first pixel PXL1 is greater than equal to a reference ratio, the first pixel circuit PXC1 may be electrically connected to the light-emitting elements LD1 and LD2 of the first pixel PXL1. For example, the reference ratio may be determined to be 2:1, 3:1, or the like. On the contrary, in case that the ratio of the number of the first polarity direction light-emitting elements LD1 to the number of the second polarity direction light-emitting elements LD2 included in the first pixel PXL1 is less than the reference ratio, the second pixel circuit PXC2 may be electrically connected to the light-emitting elements LD1 and LD2 of the first pixel PXL1.

As described above, in the pixel PXL and the display device 1000 including the same according to an embodiment, the circuits and power sources VDD and VSS to which the first and second electrodes ET1 and ET2 may be connected may be selectively determined to be opposite to each other according to a ratio of an arrangement direction of the light-emitting elements LD. Therefore, a voltage difference between the first power source VDD and the second power source VSS may be reduced to reduce power consumption and a luminance deviation and an image blur due to the randomly aligned light-emitting elements LD may be reduced.

Figure 10C:
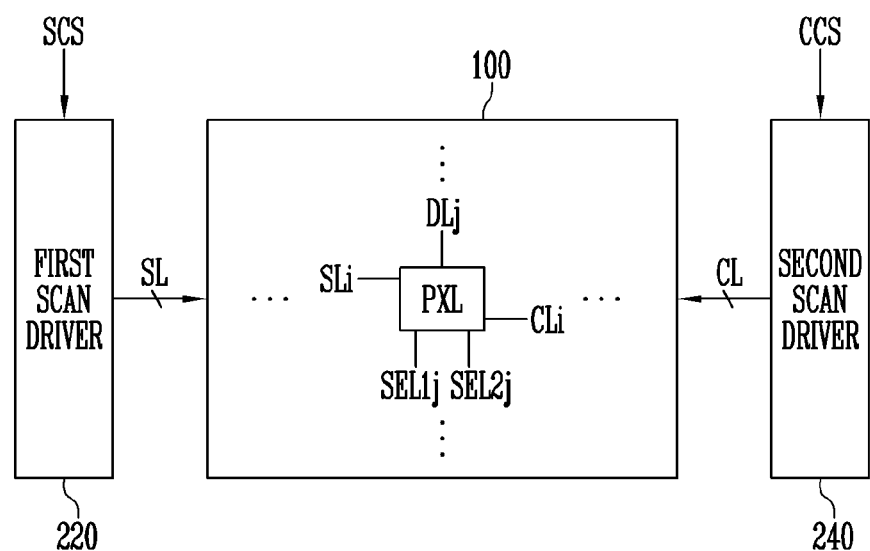
FIG. 10C is a schematic block diagram illustrating a scan driver according to an embodiment.

FIG. 10C is a schematic block diagram illustrating a scan driver according to an embodiment, for example, the scan driver included in the display device of FIG. 1.

Referring to FIGS. 1, 10A, and 10C, the scan driver 200 may include a first scan driver 220 and a second scan driver 240.

In an embodiment, in case that all scan signals and control signals supplied to the pixels in one frame period 1F, the scan signal and the control signals may be generated and output from different scan drivers, respectively.

The first scan driver 220 may supply (e.g., sequentially supply) the scan signals to the scan lines SL in response to a first control signal SCS.

The second scan driver 240 may supply (e.g., sequentially supply) the control signals to the control lines CL in response to a second control signal CCS.

Since the second scan driver 240 may be operated separately from the first scan driver 220, the supply of the control signal may be not affected by the scan signal. Therefore, a supply timing, a supply period, and the like of the control signal may be freely set according to the display device 1000.

For example, the second scan driver 240 may output a control signal in the frame period 1F included in the preparation period P1 after the display device 1000 is turned on. In an instance, until the display device is turned off after being turned on, the control signal may not be supplied after scanning is performed once. The second scan driver 240 may perform scanning once to supply (or sequentially supply) the control signal to the control lines CL during the time period that the display device is driven, and stops supplying the control signal. Correspondingly, the first and second selection signals may also be supplied only during the preparation period P1.

Figure 11:
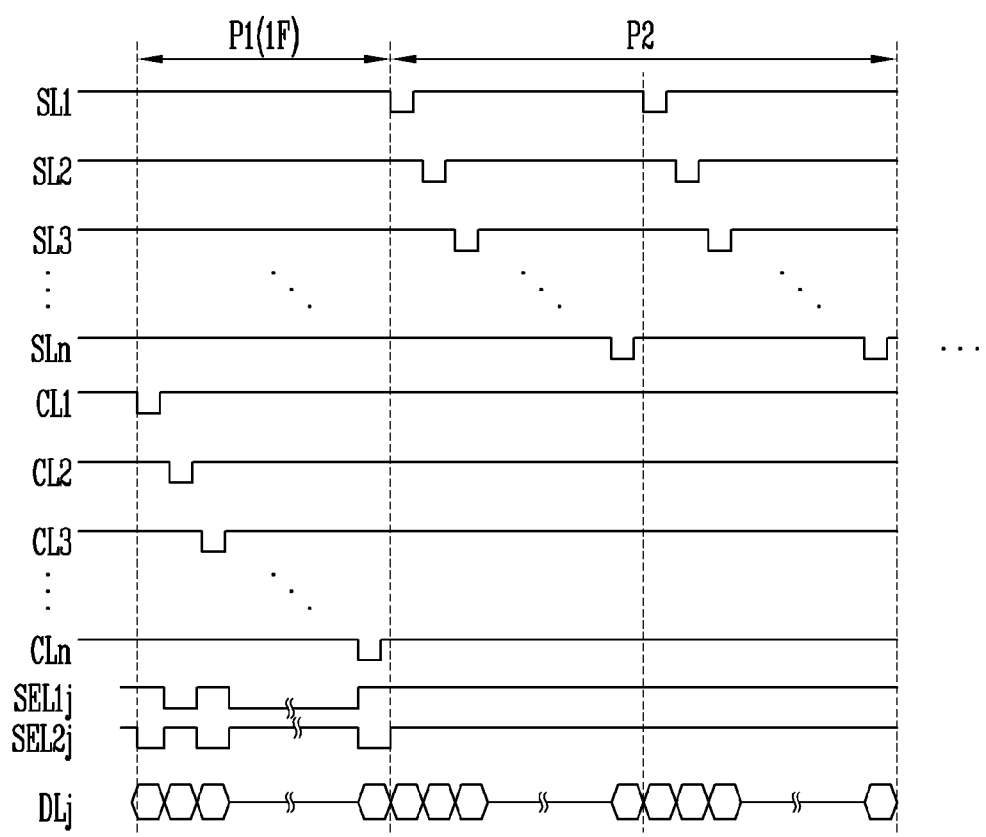
FIG. 11 is a schematic graphical view of signal waveforms to explain an operation of a display device according to an embodiment.

FIG. 11 is a schematic graphical view of signal waveforms to explain an operation of a display device according to an embodiment, for example, the display device of FIG. 1 including the pixel of FIG. 7.

Since the operation of FIG. 11 may be the same as the operation of the display device of FIG. 10A except for a period in which a control signal may be supplied, the same reference numerals will be used to refer to the same or corresponding components, and redundant descriptions will be omitted.

Referring to FIGS. 1, 7, and 11, control signals may be supplied (e.g., sequentially supplied) to control lines CL1 to CLn during a preparation period P1 (wherein n may be a natural number greater than one), and scan signals may be supplied (e.g., sequentially supplied) to scan lines SL1 to SLn during a display period P2.

The scan signal may not be supplied to the display part 100 during the preparation period P1. The first pixel circuit PXC1 or the second pixel circuit PXC2 may be selected for each pixel PXL in response to first and second selection signals supplied to the selection circuits SC1 and SC2 by the control signals during the preparation period P1. Power sources or circuits connected to the first and second electrodes ET1 and ET2 may be determined for each pixel PXL.

Thereafter, during the display period P2, all of the control signals, the first selection signal, and the second selection signal may be deactivated, and the driving of components generating the signals may also be deactivated. During the display period P2, the scan signals may be supplied (e.g., sequentially supplied), and an image may be displayed.

Figure 12:
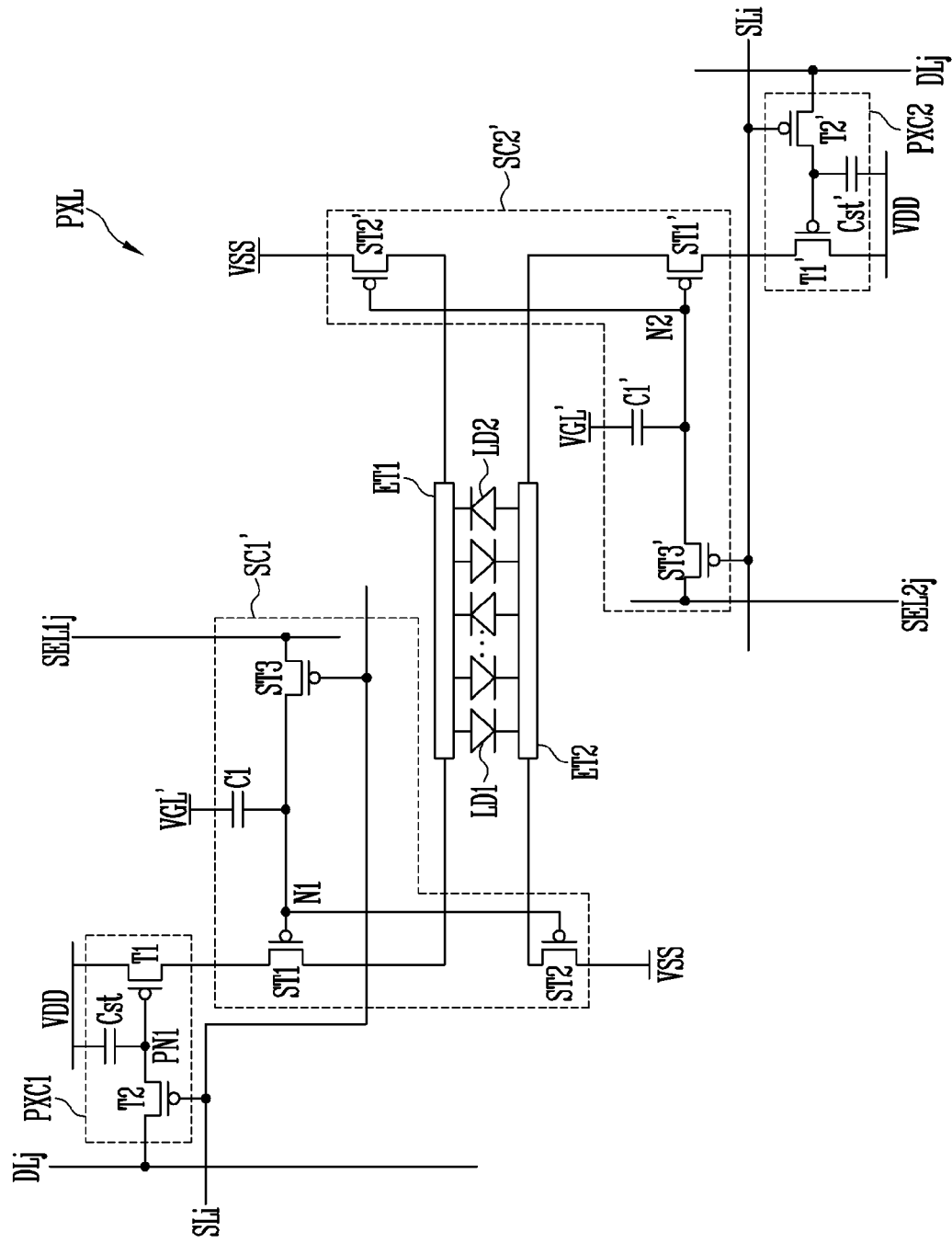
FIG. 12 is a schematic diagram illustrating a pixel according to an embodiment.
Figure 13:
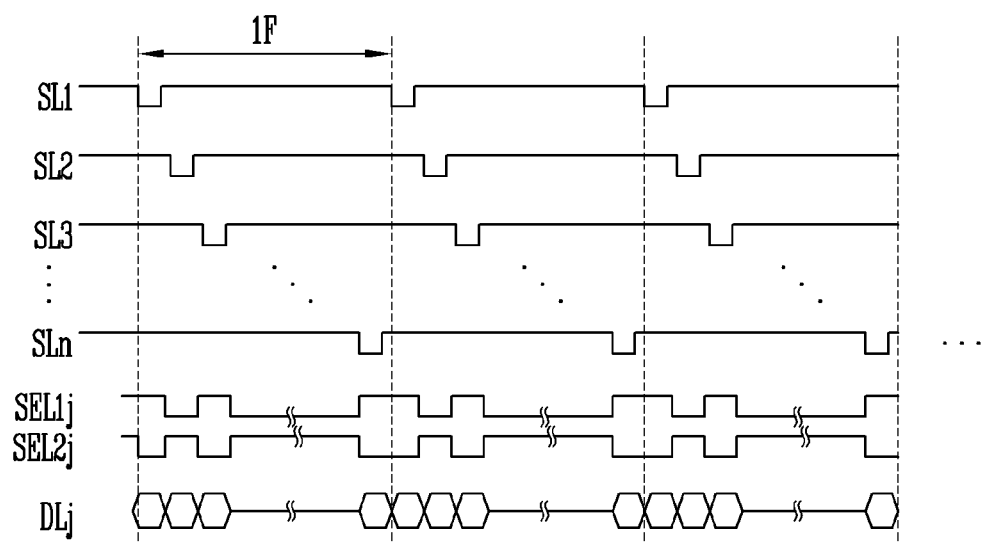
FIG. 13 is a schematic graphical view of signal waveforms to explain an operation of a display device according to an embodiment.

FIG. 12 is a schematic diagram illustrating a pixel according to an embodiment, for example, the pixel of FIG. 7. FIG. 13 is a schematic graphical view of signal waveforms to explain an operation of a display device according to an embodiment, for example, the display device of FIG. 1 including a pixel of FIG. 12.

Since the pixel of FIG. 12 may be the same as the pixel of FIG. 7 except for a configuration of a memory element, the same reference numerals will be used to refer to the same or corresponding components, and redundant descriptions will be omitted Referring to FIGS. 1, 12, and 13, a pixel PXL may include a first electrode ET1, a second electrode ET2, light-emitting elements LD1 and LD2, a first pixel circuit PXC1, a first selection circuit SC1', a second pixel circuit PXC2, and a second selection circuit SC2'.

The first selection circuit SC1' may control an electrical connection between the first pixel circuit PXC1 and a first electrode ET1 and an electrical connect between a second power source VSS and a second electrode ET2 based on a first selection signal.

In an embodiment, the first selection circuit SC1' may include a first selection transistor ST1, a second selection transistor ST2, a third selection transistor ST3, and a capacitor C1 corresponding to a memory element.

The capacitor C1 may be connected between a first node N1 and a third power source VGL'. The third power source VGL' may be a constant voltage power source or a ground power source.

In an embodiment, a gate electrode of the third selection transistor ST3 may be connected to a scan line SLi. For example, gate electrodes of the second transistor T2 and the third selection transistor ST3 may be commonly connected to the scan line SLi and may simultaneously receive scan signals.

Accordingly, the third selection transistor ST3 may be turned on every frame, and a voltage of a first select signal supplied to a first selection signal line SEL1j may be stored in the capacitor C1.

For example, in case that the first pixel circuit PXC1 is to be selected, the first selection signal may have a logic low level. A logic low level voltage may be stored in the capacitor C1, and the first and second selection transistors ST1 and ST2 may maintain a turned-on state during a frame period 1F by the voltage stored in the capacitor C1.

On the contrary, in case that the second pixel circuit PXC2 is to be selected, the first selection signal may have a logic high level. A logic high level voltage may be stored in the capacitor C1, and the first and second selection transistors ST1 and ST2 may maintain a turned-off state during a frame period 1F by the voltage stored in the capacitor C1.

Similar to the first selection circuit SC1', the second selection circuit SC2' may also include a capacitor C1' that stores a voltage of a second selection signal supplied to a second selection signal line SEL2j.

Accordingly, one of the first and second pixel circuits PXC1 and PXC2 may be selected to display an image in response to a supply of a scan signal every frame period 1F. Thus, a component and control lines for generating a separate control signal may be removed. However, as shown in FIG. 13, the first and second selection signals may be supplied in order to select a pixel circuit every frame period 1F.

As described above, since a memory element is implemented by only the capacitors C1 and C1', a pixel structure and a wire of a display region may be further simplified.

Figure 14:
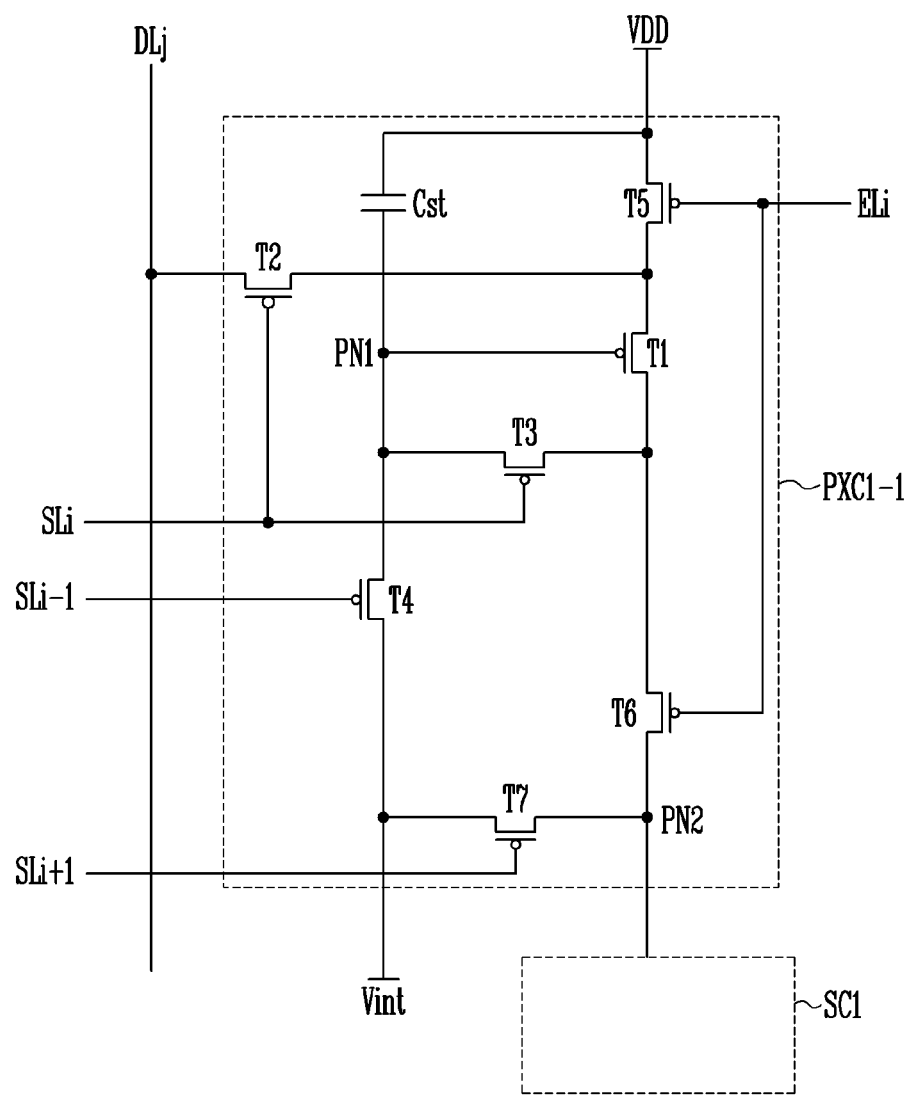
FIG. 14 is a schematic circuit diagram illustrating f a pixel circuit according to an embodiment.
Figure 15:
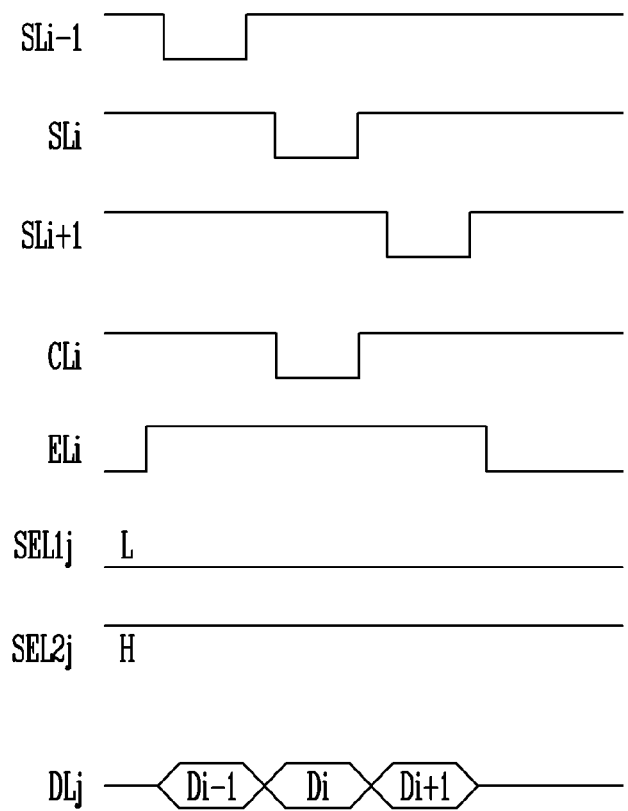
FIG. 15 is a schematic graphical view of signal waveforms to explain an operation of a pixel according to an embodiment.

FIG. 14 is a schematic circuit diagram illustrating a pixel circuit according to an embodiment, for example, a pixel circuit included in the pixel of FIG. 7. FIG. 15 is a schematic graphical view of signal waveforms to explain an operation of a pixel according to an embodiment, for example, the pixel of FIG. 14.

FIG. 14 shows an example of a first pixel circuit. However, a second pixel circuit may also have a configuration substantially the same as that of the first pixel circuit.

Referring to FIGS. 7, 14, and 15, a first pixel circuit PXC1-1 may be further connected to at least one scan line other than a scan line SLi of a corresponding horizontal line. In an example, a pixel circuit PXC of the pixel PXL disposed in an $i^{th}$ row may be further connected to an $(i-1)^{th}$ scan line SLi-1 and/or an $(i+1)^{th}$ scan line SLi+1. According to an embodiment, the first pixel circuit PXC1-1 may be further connected to a third power source in addition to first and second power sources VDD and VSS. For example, the first pixel circuit PXC1-1 may also be connected to an initialization power source Vint. According to embodiments, the first pixel circuit PXC-1 may include first to seventh transistors T1 to T7 and a storage capacitor Cst.

The first transistor T1 may be electrically connected between the first power source VDD and the light source part LSU of FIG. 7. For example, one electrode (for example, a source electrode) of the first transistor T1 may be connected to the first power source VDD through the fifth transistor T5, and another electrode (e.g., a drain electrode) of the first transistor T1 may be connected to one electrode (for example, a first electrode of a corresponding pixel PXL) of the light source part LSU through the sixth transistor T6 and a first selection circuit (see SC1 of FIG. 7, for example, the first selection transistor ST1). A gate electrode of the first transistor T1 may be connected to a first pixel node PN1.

The second transistor T2 may be connected between a data line DLj and one electrode of the first transistor T1. A gate electrode of the second transistor T2 may be connected to the scan line SLi. In case that a scan signal may be supplied from the scan line SLi, the second transistor T2 may be turned on to electrically connect the data line DLj to one electrode of the first transistor T1.

The third transistor T3 may be connected between another electrode of the first transistor T1 and the first pixel node PN1. A gate electrode of the third transistor T3 may be connected to the scan line SLi. In case that a scan signal may be supplied from the scan line SLi, the third transistor T3 may be turned on to connect the first transistor T1 in the form of a diode.

The fourth transistor T4 may be connected between the first pixel node PN1 and the initialization power source Vint. A gate electrode of the fourth transistor T4 may be connected to a scan line, for example, an $(i-1)^{th}$ scan line SLi-1. In case that a scan signal may be supplied form the $(i-1)^{th}$ scan line SLi-1, the fourth transistor T4 may be turned on to transmit a voltage of the initialization power source Vint to the first pixel node PN1. According to embodiments, in case that the first transistor T1 is a p-type transistor, the voltage of the initialization power source Vint for initializing a gate voltage of the first transistor T1 may be less than or equal to a lowest voltage of a data signal.

The fifth transistor T5 may be connected between the first power source VDD and the first transistor T1. A gate electrode of the fifth transistor T5 may be connected to a corresponding emission control line, for example, an $i^{th}$ emission control line ELi.

The sixth transistor T6 may be connected between the first transistor T1 and a second pixel node PN2. A gate electrode of the sixth transistor T6 may be connected to the $i^{th}$ emission control line ELi.

The seventh transistor T7 may be connected between the second pixel node PN2 and the initialization power source Vint. A gate electrode of the seventh transistor T7 may be connected to any one of subsequent scan lines, for example, an $(i+1)^{th}$ scan line SLi+1. The seventh transistor T7 may be turned on to the voltage of the initialization power source Vint to one electrode of the light source part LSU. Accordingly, during each initialization period during the voltage of the initialization power source Vint may be transmitted to the light source part LSU, a voltage of one electrode of the light source part LSU may be initialized. A control signal for controlling operation of the seventh transistor T7 may be variously changed. For example, in another embodiment, the gate electrode of the seventh transistor T7 may also be connected to a scan line of a corresponding horizontal line, i.e., the $i^{th}$ scan line SLi.

The storage capacitor Cst may be connected to the first power source VDD and the first pixel node PN1. The storage capacitor Cst may store a voltage corresponding to a data signal and a threshold voltage of the first transistor T1 during each frame period.

In an embodiment, as shown in FIG. 15, control signals supplied to selection circuits SC1 and SC2 of the pixel PXL through control lines may be synchronized with a scan signal supplied to the $i^{th}$ scan line SLi and may be supplied. However, this is merely an example, and a timing at which a control signal may be supplied is not limited thereto.

Transistors included in the pixel circuit PXC, for example, the first to seventh transistors T1 to T7 are illustrated in FIG. 14 as being all p-type transistors, but the invention is not limited thereto. For example, at least one of the first to seventh transistors T1 to T7 may be changed to an n-type transistor.

Some of the first to seventh transistors T1 to T7 may be low temperature polysilicon (LTPS) transistors including a polysilicon-based LTPS active layer, and others may be oxide semiconductor transistors including an oxide semiconductor active layer.

Figure 16:
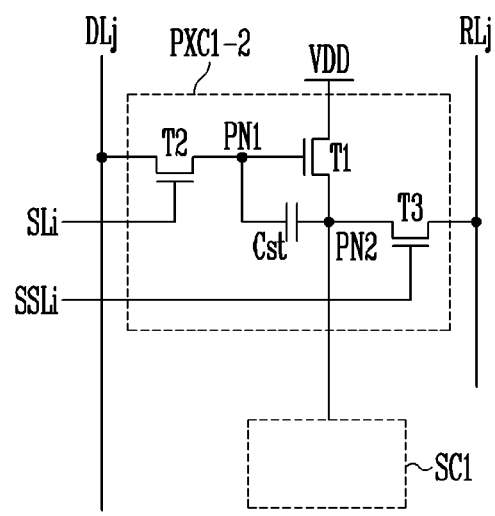
FIG. 16 is a schematic circuit diagram illustrating a pixel circuit according to an embodiment.

FIG. 16 is a schematic circuit diagram illustrating a pixel circuit according to an embodiment, for example, a pixel circuit included in the pixel of FIG. 7.

Since the pixel circuit of FIG. 16 may be the same as the pixel of FIG. 7 except for the type of transistors and a configuration of a third transistor, the same reference numerals will be used to refer to the same or corresponding components, and redundant descriptions will be omitted.

Referring to FIGS. 7 and 16, a pixel circuit PXC1-2 of FIG. 16 may include first, second, and third transistors T1, T2, and T3 and a storage capacitor Cst.

The pixel circuit PXC1-2 may be applied to an external compensation pixel.

The third transistor T3 may be connected between a readout line RLj and one electrode of the first transistor T1 (for example, a second pixel node PN2). A gate electrode of the third transistor T3 may be connected to a sensing line SSLi. The third transistor T3 may transmit a sensing current to the readout line RLj in response to a sensing signal transmitted through the sensing line SSLi. The sensing current may be used to calculate an amount of change in mobility and threshold voltage of the first transistor T1. Pieces of information about mobility and a threshold voltage may be calculated according to a relationship between the sensing current and a sensing voltage. In an embodiment of a light source part LSU including light-emitting elements LD1 and LD2, the sensing current may be converted into the form of a voltage and may be used for an operation of compensating for a data voltage.

The storage capacitor Cst may be connected between the first pixel node PN1 and a second pixel node PN2. The storage capacitor Cst may store a voltage of the first pixel node PN1.

The transistors T1, T2, and T3 are illustrated in FIG. 16 as being NMOS transistors, but the invention is not limited thereto. At least some transistors may be replaced with PMOS transistors.

As described above, pixel circuits having various structures may be applied to a pixel including a selection circuit SC1.

As described above, in a pixel and a display device including the same according to embodiments, circuits and power sources VDD and VSS to which first and second electrodes may be selectively connected may be determined to be opposite to each other according to a ratio of an arrangement direction of light-emitting elements. Therefore, a voltage difference between a first power source and a second power source may be reduced to reduce power consumption and a luminance deviation and an image blur due to randomly aligned light-emitting elements LD may be reduced.

According to a pixel and a display device according to embodiments, circuits and power sources to which first and second electrodes may be connected may be selectively determined to be opposite to each other according to a ratio of an arrangement direction of light-emitting elements. Therefore, a voltage difference between a first power source and a second power source may be reduced to reduce power consumption and a luminance deviation and an image blur due to randomly aligned light-emitting elements may be reduced.

However, effects of the embodiments are not limited to the above-described effect, but may be variously modified without departing from the spirit and scope of the invention.

Although the invention has been described with reference to the exemplary embodiments, those skilled in the art will appreciate that various modifications and variations can be made in the invention without departing from the spirit or scope of the invention described in the appended claims.

What is claimed is:

1. A pixel comprising:
  a first electrode and a second electrode spaced apart from each other;
  light-emitting elements electrically connected to the first electrode and the second electrode;

a first pixel circuit connected to a first power source and generating a driving current based on a scan signal and a data signal; and
a first selection circuit that controls an electrical connection between the first pixel circuit and the first electrode and an electrical connection between a second power source and the second electrode, based on a first selection signal and a control signal that enables the first selection signal.

2. A pixel comprising:
a first electrode and a second electrode spaced apart from each other;
light-emitting elements electrically connected to the first electrode and the second electrode;
a first pixel circuit connected to a first power source and generating a driving current based on a scan signal and a data signal;
a first selection circuit that controls an electrical connection between the first pixel circuit and the first electrode and an el connection between a second power source and the second electrode, based on a first selection signal;
a second pixel circuit connected to the first power source and generating a driving current based on the scan signal and the data signal; and
a second selection circuit that controls an electrical connection between the second pixel circuit and the second electrode and an electrical connection between the second power source and the first electrode, based on a second selection signal.

3. The pixel of claim 2, wherein the first selection circuit comprises:
a first selection transistor connected between the first pixel circuit and the first electrode, the first selection transistor including a gate electrode connected to a first node;
a second selection transistor connected between the second power source and the second electrode, the second selection transistor including a gate electrode connected to the first node;
a memory element connected to the first node; and
a third selection transistor connected between a first selection line for supplying the first selection signal and the memory element, the third selection transistor including a gate electrode connected to a control line for supplying a control signal.

4. The pixel of claim 3, wherein the memory element comprises a first inverter and a second inverter which are mutually feedback-connected with each other between the first node and the third selection transistor.

5. The pixel of claim 4, wherein the first inverter comprises:
a first inverting transistor connected between the first node and a low power source, the first inverting transistor including a gate electrode connected to a second node; and
a second inverting transistor connected between the first node and a high power source, the second inverting transistor including a gate electrode connected to the second node.

6. The pixel of claim 5, wherein the second inverter comprises:
a third inverting transistor connected between the second node and the low power source, the third inverting transistor including a gate electrode connected to the first node; and
a fourth inverting transistor connected between the second node and the high power source, the fourth inverting transistor including a gate electrode connected to the first node.

7. The pixel of claim 3, wherein the memory element comprises a capacitor coupled between the first node and a third power source.

8. The pixel of claim 7, wherein the control signal is substantially the same as the scan signal.

9. The pixel of claim 2, wherein the second selection circuit comprises:
a first selection transistor connected between the second pixel circuit and the second electrode, the first selection transistor including a gate electrode connected to a first node;
a second selection transistor connected between the second power source and the first electrode, the second selection transistor including a gate electrode connected to the first node;
a memory element connected to the first node; and
a third selection transistor connected between a second selection line for supplying the second selection signal and the memory element, the third selection transistor including a gate electrode connected to a control line for supplying a control signal.

10. The pixel of claim 2, wherein each of the light-emitting elements is a first polarity direction light-emitting element or a second polarity direction light-emitting element, the first polarity direction light-emitting element and the second polarity direction light-emitting element having opposite polarity directions.

11. The pixel of claim 10, wherein, in case that a number of the first polarity direction light-emitting elements is greater than or equal to a number of the second polarity direction light-emitting elements, the first pixel circuit is electrically connected to the light-emitting elements in response to the first selection signal.

12. The pixel of claim 10, wherein, in case that a number of the first polarity direction light-emitting elements is less than a number of the second polarity direction light-emitting elements, the second pixel circuit is electrically connected to the light emitting elements in response to the second selection signal.

13. The pixel of claim 10, wherein,
in case that a ratio of a number of the first polarity direction light-emitting elements to a number of the second polarity direction light-emitting elements is greater than or equal to a reference ratio, the first pixel circuit is electrically connected to the light-emitting elements, and
wherein, in case that a ratio of a number of the first polarity direction light-emitting elements to a number of the second polarity direction light-emitting elements is less than the reference ratio, the second pixel circuit is electrically connected to the light-emitting elements.

14. The pixel of claim 10, wherein,
in case that the first pixel circuit is electrically connected to the light-emitting elements, a voltage of the second power source is supplied to the second electrode, and
in case that the second pixel circuit is electrically connected to the light-emitting elements, the voltage of the second power source is supplied to the first electrode.

15. The pixel of claim 2, wherein each of the first and second pixel circuits comprises:
a first transistor that controls the driving current supplied to the light-emitting elements based on a voltage applied to a gate electrode of the first transistor; and a second transistor connected between a data line for supplying the data signal and the first transistor, the second transistor including a gate electrode connected to a scan line for supplying the scan signal.

16. A display device comprising:

pixels each including light-emitting elements electrically connected to a first electrode and a second electrode;

a scan driver that supplies a scan signal to the pixels through scan lines and supplies a control signal to the pixels through control lines;

a data driver that supplies a data signal to the pixels through data lines; and a selection signal driver that supplies a first selection signal to the pixels through first selection signal lines and a second selection signal to the pixels through second selection signal lines, wherein each of the pixels comprises:
　a first pixel circuit connected to a first power source, and including a first driving transistor that generates a driving current based on the scan signal and the data signal;
　a first selection circuit that electrically connects the first pixel circuit and the first electrode and electrically connects a second power source and the second electrode, in response to the first selection signal;
　a second pixel circuit connected to the first power source, and including a second driving transistor that generates a driving current based on the scan signal and the data signal; and
　a second selection circuit that electrically connects the second pixel circuit and the second electrode and electrically connects the second power source and the first electrode, in response to the second selection signal.

17. The display device of claim 16, wherein the scan driver performs scanning once to supply the control signal to the control lines during a time period that the display device is driven, and stops supplying the control signal.

18. The display device of claim 16, wherein
　the selection signal driver supplies the first selection signal and the second selection signal to each of pixel columns through the first and second selection signal lines, in response to the control signal, and
　the second selection signal is an inversion signal of the first selection signal.

19. The display device of claim 16, wherein each of the light-emitting elements is a first polarity direction light-emitting element or a second polarity direction light-emitting element, the first polarity light-emitting element and the second polarity light-emitting element having opposite polarity directions.

20. The display device of claim 16, wherein the pixels comprises:
　a first pixel including:
　　a first electrode connected to the first pixel circuit; and
　　a second electrode connected to the second power source; and
　a second pixel including:
　　a first electrode connected to the second power source; and
　　a second electrode connected to the second pixel circuit.

* * * * *